US012651108B2

(12) United States Patent

Ding et al.

(10) Patent No.: US 12,651,108 B2

(45) Date of Patent: Jun. 9, 2026

(54) COLOR GRAPH REDUCTION ON A LINE OF CONNECTED STRUCTURES

(71) Applicant: Synopsys, Inc., Sunnyvale, CA (US)

(72) Inventors: Xuerong Ding, Shanghai (CN); Yuli Xue, Shanghai (CN); Chen Gao, Shanghai (CN)

(73) Assignee: Synopsys, Inc., Sunnyvale, CA (US)

( * ) Notice: Subject to any disclaimer, the term of this patent is extended or adjusted under 35 U.S.C. 154(b) by 690 days.

(21) Appl. No.: 18/127,364

(22) Filed: Mar. 28, 2023

(65) Prior Publication Data

US 2023/0315967 A1     Oct. 5, 2023

Related U.S. Application Data

(60) Provisional application No. 63/326,183, filed on Mar. 31, 2022.

(51) Int. Cl.
G06F 30/392 (2020.01)

(52) U.S. Cl.
CPC .................................. G06F 30/392 (2020.01)

(58) Field of Classification Search
CPC ........ G06F 30/30; G06F 30/39; G06F 30/392; G06F 30/394; G06F 30/391; H10D 89/10

USPC ......................................................... 716/100
See application file for complete search history.

(56) References Cited

U.S. PATENT DOCUMENTS

2014/0149715 A1*    5/2014    Inman ............... G06F 15/17393
                                                               712/29

* cited by examiner

*Primary Examiner* — Paul Dinh

(74) *Attorney, Agent, or Firm* — Patterson + Sheridan, LLP

(57)     ABSTRACT

The present disclosure describes systems and methods for assigning nodes in a circuit design to layers. The method includes identifying a plurality of structures in a circuit design. Each of the plurality of structures includes four nodes of the circuit design and each of the four nodes are connected to every other node in the respective structure. The method also includes removing, from the plurality of structures, an even number of pairs of connected nodes of the circuit design to form a reduced node structure and assigning circuit layers for the nodes in the reduced node structure. The method further includes assigning, by a processing device, circuit layers for the pairs of connected nodes removed from the plurality of structures based on the assigned circuit layers for the nodes in the reduced node structure.

20 Claims, 25 Drawing Sheets
(22 of 25 Drawing Sheet(s) Filed in Color)

Original large graph
before reduction

302

Original large graph
before reduction

702

302

Original large graph
before reduction

702

Original large graph
before reduction

2200

2300

2400

COLOR GRAPH REDUCTION ON A LINE OF CONNECTED STRUCTURES

RELATED APPLICATION

This application claims priority to and the benefit of U.S. Provisional Patent Application Ser. No. 63/326,183, entitled "Four Color Graph Reduction on a Line of Connected Structures" filed Mar. 31, 2022, which is incorporated herein by reference in its entirety.

TECHNICAL FIELD

The present disclosure relates to circuit design and layout.

BACKGROUND

One step in the design and layout of circuits is to assign the nodes or polygons in a circuit design to layers that are patterned differently during lithography. It is typically a goal to assign connected nodes to different layers or to minimize the number of connected nodes that are assigned to the same layer (which may be referred to as a layer conflict or a color conflict). During the design and layout process, the nodes are assigned to different layers indicated by colors, with different colors representing an assignment to a different layer.

SUMMARY

The present disclosure describes systems and methods for assigning nodes in a circuit design to layers. According to an embodiment, a method for determining layers for nodes in a circuit design includes identifying a plurality of structures in a circuit design. Each of the plurality of structures includes four nodes of the circuit design and each of the four nodes are connected to every other node in the respective structure. The method also includes removing, from the plurality of structures, an even number of pairs of connected nodes of the circuit design to form a reduced node structure and assigning circuit layers for the nodes in the reduced node structure. The method further includes assigning, by a processing device, circuit layers for the pairs of connected nodes removed from the plurality of structures based on the assigned circuit layers for the nodes in the reduced node structure.

Each of the pairs of connected nodes may be shared by two of the plurality of structures.

Removing the even number of pairs of connected nodes from the plurality of structures may include refraining from removing a pair of connected nodes at a first end of the plurality of structures and refraining from removing a pair of connected nodes at a second end of the plurality of structures opposite the first end. Assigning the circuit layers for the pairs of connected nodes removed from the plurality of structures may include assigning at least one node in a first pair of connected nodes of the pairs of connected nodes to a same circuit layer assigned to a node in the pair of connected nodes at the second end. The first pair of connected nodes may be connected to the pair of connected nodes at the first end. Assigning the circuit layers for the pairs of connected nodes removed from the plurality of structures may include determining that nodes of the pair of connected nodes at the first end are assigned to different circuit layers and assigning the circuit layers for a pair of connected nodes connected to the pair of connected nodes at the first end before assigning circuit layers for other pairs of connected nodes removed from the plurality of structures.

Assigning the circuit layers for the pairs of connected nodes removed from the plurality of structures may include, for each of the pairs of connected nodes, assigning a first node and a second node of the respective pair of connected nodes to different circuit layers.

Assigning the circuit layers for the pairs of connected nodes removed from the plurality of structures may include, for each of the pairs of connected nodes, assigning circuit layers to the respective pair of connected nodes different from circuit layers assigned to another pair of connected nodes connected to the respective pair of connected nodes.

The method may include performing lithography for the nodes and the pairs of connected nodes based on their assigned circuit layers.

According to another embodiment, a system for determining layers for nodes in a circuit design includes a memory and a processor communicatively coupled to the memory. The processor identifies a plurality of structures in a circuit design. Each of the plurality of structures corresponds to four nodes of the circuit design and each of the four nodes are connected to every other node in the respective structure. The processor also removes, from the plurality of structures, an even number of pairs of connected nodes of the circuit design to form a reduced node structure, assigns circuit layers for the nodes in the reduced node structure, and assigns circuit layers for the pairs of connected nodes removed from the plurality of structures based on the assigned circuit layers for the nodes in the reduced node structure.

Each of the pairs of connected nodes may be shared by two of the plurality of structures.

Removing the even number of pairs of connected nodes from the plurality of structures may include refraining from removing a pair of connected nodes at a first end of the plurality of structures and refraining from removing a pair of connected nodes at a second end of the plurality of structures opposite the first end. Assigning the circuit layers for the pairs of connected nodes removed from the plurality of structures may include assigning at least one node in a first pair of connected nodes of the pairs of connected nodes to a same circuit layer assigned to a node in the pair of connected nodes at the second end. The first pair of connected nodes may be connected to the pair of connected nodes at the first end. Assigning the circuit layers for the pairs of connected nodes removed from the plurality of structures may include determining that nodes of the pair of connected nodes at the first end are assigned to different circuit layers and assigning the circuit layers for a pair of connected nodes connected to the pair of connected nodes at the first end before assigning circuit layers for other pairs of connected nodes removed from the plurality of structures.

Assigning the circuit layers for the pairs of connected nodes removed from the plurality of structures may include, for each of the pairs of connected nodes, assigning a first node and a second node of the respective pair of connected nodes to different circuit layers.

Assigning the circuit layers for the pairs of connected nodes removed from the plurality of structures may include, for each of the pairs of connected nodes, assigning circuit layers to the respective pair of connected nodes different from circuit layers assigned to another pair of connected nodes connected to the respective pair of connected nodes.

Lithography may be performed for the nodes and the pairs of connected nodes based on their assigned circuit layers.

According to another embodiment, a non-transitory computer readable medium stores instructions that, when executed by a processor, cause the processor to identify an even number of pairs of connected nodes of a circuit design and identify a plurality of nodes of the circuit design outside the identified even number of pairs of connected nodes. The processor also assigns circuit layers for the plurality of nodes and assigns circuit layers for the identified even number of pairs of connected nodes based on the assigned circuit layers for the plurality of nodes.

Each of the even number of pairs of connected nodes may include four nodes of the circuit design and each of the four nodes are connected to every other node in the even number of pairs of connected nodes.

Assigning the identified even number of pairs of connected nodes may include, for each of the pairs of connected nodes, assigning a first node and a second node of the respective pair of connected nodes to different circuit layers.

Assigning the circuit layers for the identified even number of pairs of connected nodes may include, for each of the pairs of connected nodes, assigning circuit layers to the respective pair of connected nodes different from circuit layers assigned to another pair of connected nodes connected to the respective pair of connected nodes.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale. The patent or application file contains at least one drawing executed in color. Copies of this patent or patent application publication with color drawing(s) will be provided by the Office upon request and payment of the necessary fee.

DETAILED DESCRIPTION

Figure 1:
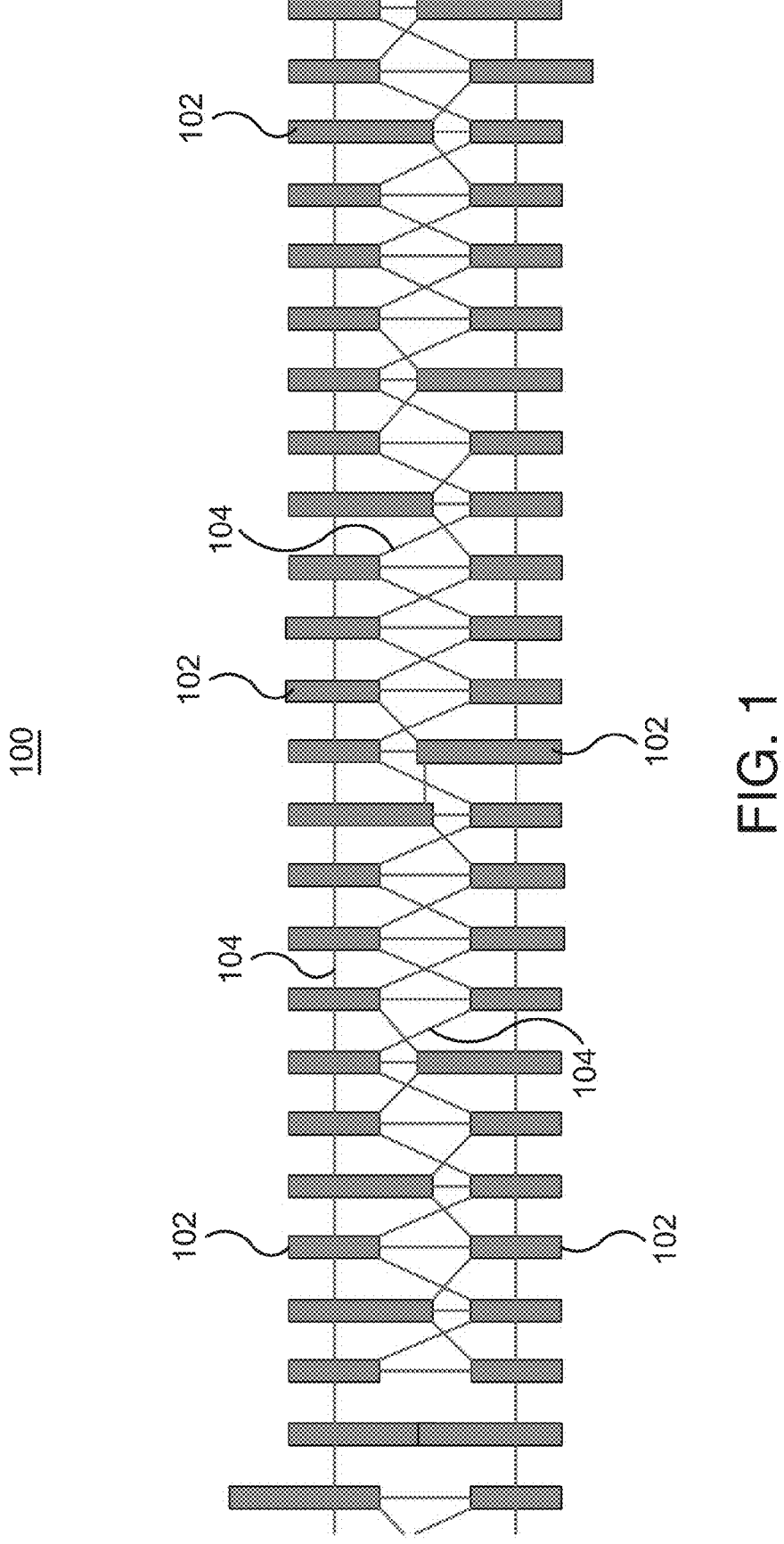
FIG. 1 illustrates an example circuit design.

During circuit design and layout, the nodes or polygons that represent elements in a circuit design are assigned to layers that are patterned differently during lithography. Different layers are represented by different colors in a layout of the circuit design. Assigning circuit elements that are directly connected to each other in the circuit design to the same layer may cause these circuit elements to be too close to each other and result in a space violation. Thus, it is typically a goal to assign these connected circuit elements (e.g., represented by connected nodes in a graph) to different layers or to minimize the number of connected nodes that are assigned to the same layer (which may be referred to as a layer conflict or a color conflict).

When three or more layers are available to which nodes of a circuit design may be assigned, the assignment problem (also referred to as the colorability problem) becomes an np-complete problem, which is a class of problems for which there is no known algorithm to solve the problems in polynomial time. Stated differently, existing solutions for the assignment problem can take a very long time, especially when the circuit design is large (e.g., when the circuit design includes a large number of circuit elements and a large number of electrical connections between the circuit elements) and thus utilize a large amount of computing resources.

The present disclosure describes a technique for reducing the amount of time it takes to assign the elements of a circuit design to layers. The circuit design may be represented by a graph that includes nodes representing the circuit elements in the circuit design. The graph also includes edges connecting the nodes (which may be referred to as connections) if the circuit elements represented by those nodes are electrically connected to each other in the circuit design. Generally, the technique involves first reducing the size of the graph input to the assignment operation, which reduces the number of nodes and connections that the assignment operation analyzes. For example, the technique may involve removing nodes and connections that form k4 structures, which may be structures that includes four nodes that are all connected to each other. The remaining nodes may then be assigned to layers. After the operation has assigned some of the nodes to layers, the remaining nodes, which were previously removed, may be assigned to layers without introducing layer conflicts (e.g., when connected nodes are assigned to the same layer) by following certain rules based on the nodes that have already been assigned to layers. For example, a first rule may indicate from which end of the graph to start assigning nodes to layers. A second rule and a third rule may indicate to which layers a pair of nodes should be assigned.

In certain embodiments, the technique provides several technical advantages. For example, the technique may reduce the amount of time it takes to assign the nodes to layers. As another example, by reducing the number of nodes and connections that are initially analyzed, the technique may reduce the amount of processor and memory resources that are used to assign the nodes to layers. Thus, the technique improves the functioning of a computer system during the circuit design and layout.

FIG. 1 illustrates an example circuit design 100. As seen in FIG. 1, the circuit design 100 includes rows of nodes 102 that are connected by edges 104 to other nodes 102. For clarity, not all of the nodes 102 and edges 104 are labeled in FIG. 1. The nodes 102 may also be referred to as vertices. As seen in FIG. 1, the nodes 102 may be connected to other adjacent nodes 102 by the edges 104. The nodes 102 may indicate certain components (e.g., transistors, resistors, capacitors, diodes, etc.) of the circuit design 100. The edges 104 may indicate an electrical connection between the components represented by the connected nodes 102.

The nodes 102 may be separated into any suitable number of layers (e.g., four or more different layers) for lithography. These layers may be identified or represented using different colors. The edges 104 may form one layer and may be generated by a layout verification tool. Two nodes 102 connected by an edge 104 may be too close in distance to each other and should be separated into different layers. With an analogy to graph theory, each node 102 may be treated as a separate vertex in a graph, and each edge 104 connecting two nodes 102 is an edge in the graph.

Figure 2:
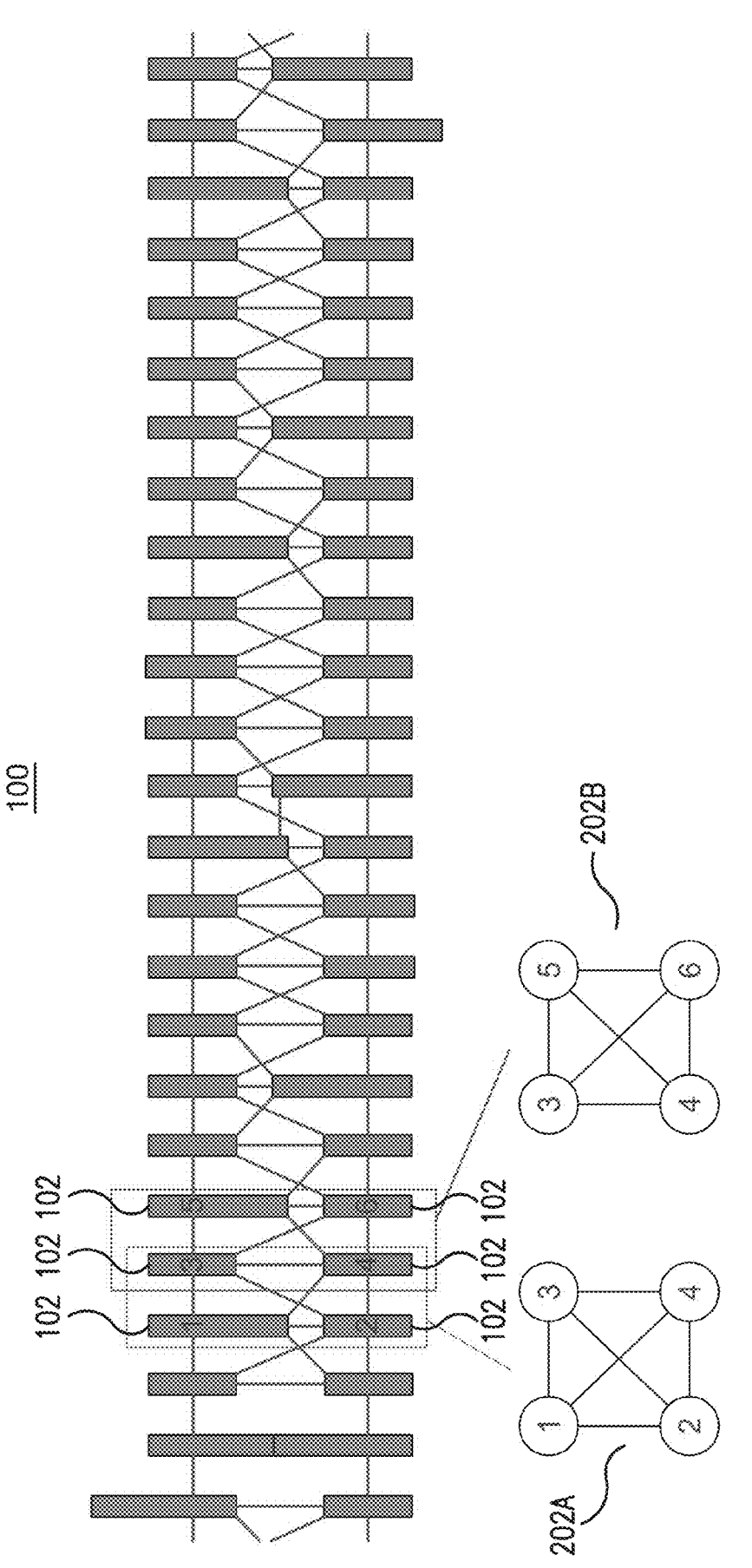
FIG. 2 illustrates example k4 structures in the circuit design of FIG. 1.

FIG. 2 illustrates example k4 structures 202 in the circuit design 100 of FIG. 1. K4 structures 202 are important to the circuit design reduction process as the circuit design reduction process attempts to reduce the size of the circuit design 100 by removing k4 structures from the circuit design 100. A k4 structure 202 is a connected structure in a portion of the circuit design 100 that forms a complete graph, which includes four nodes 102 and six edges 104. In other words, a k4 structure 202 includes four nodes 102, and each node 102 is connected to every other node 102 in the k4 structure 202.

In the example of FIG. 2, the nodes 102 labeled 1, 2, 3, and 4 form one k4 structure 202A, and the nodes 102 labeled 3, 4, 5, and 6 form another k4 structure 202B. The nodes 102 labeled 3 and 4 are shared by these two k4 structures 202A and 202B. Several other k4 structures 202 are present in the circuit design 100 but are not labeled for clarity.

Figure 3A:
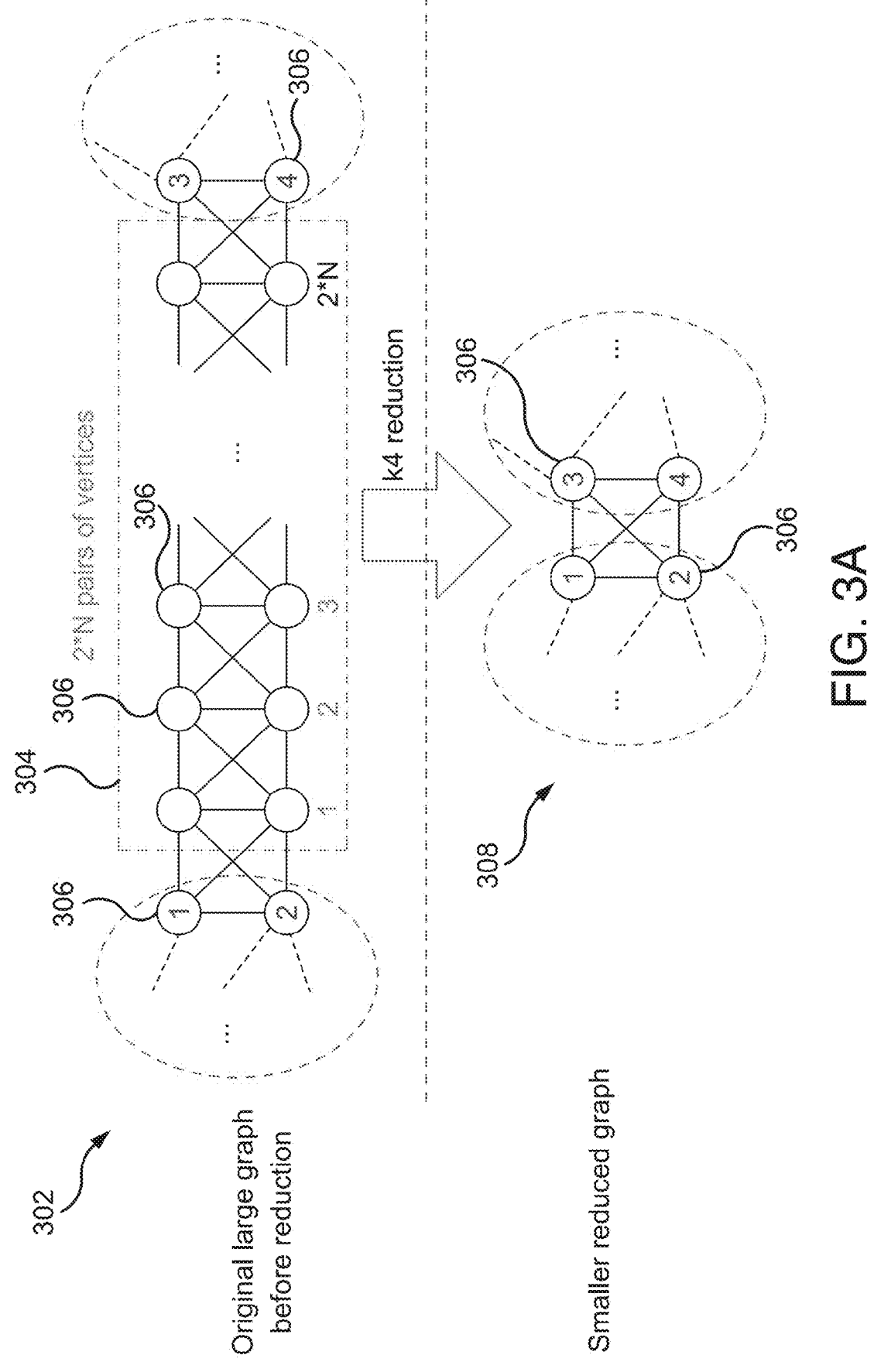
FIG. 3A illustrates an example circuit reduction.

FIG. 3A illustrates an example circuit reduction for a graph 302 extracted from the geometry of nodes 102 and edges 104 for the circuit design 100 shown in FIGS. 1 and 2. With the circuit reduction, a line 304 of k4 structures is removed (e.g., remove an even number of pairs of nodes 306) to form a smaller reduced graph 308 (e.g. a reduced circuit design). The original large graph 302 before reduction and smaller reduced graph 308 may have the same colorability. As seen in FIG. 3A, the circuit reduction removes the nodes 306 between the pairs of nodes 306 at the ends of the graph 302. These nodes 306 are labeled 1, 2, 3, and 4. The reduced graph 308 includes only the nodes 1, 2, 3, and 4 connected to each other. For clarity, not all of the nodes 306 in the graph 302 or the reduced graph 308 are labeled. Then, software programs may be run on this reduced graph 308, which saves runtime and processor and memory resources by reducing the number of nodes 102 and edges 104 analyzed by the software program.

Figure 3B:
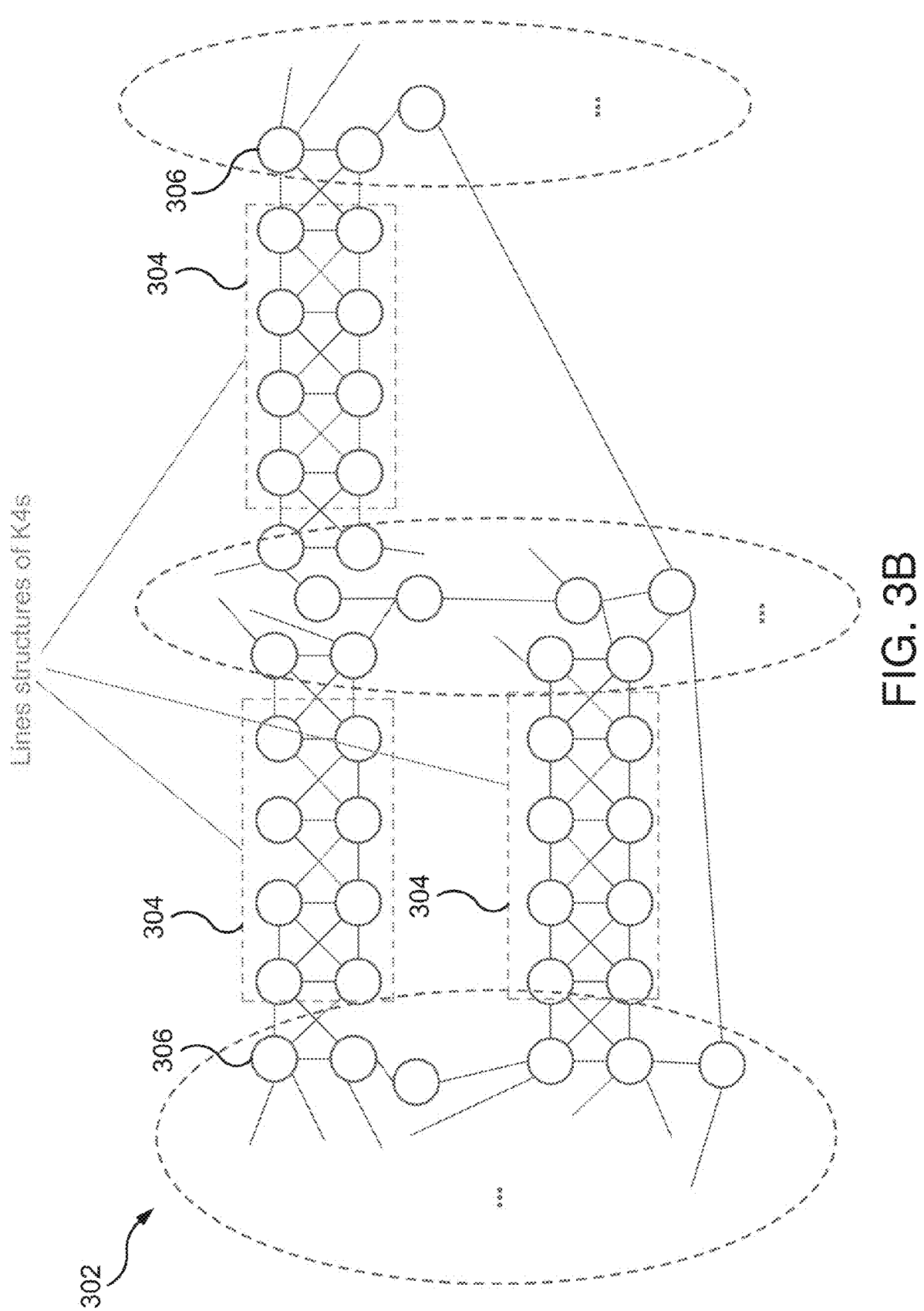
FIG. 3B illustrates an example graph.

FIG. 3A may illustrate only a portion of the graph 302. The graph 302 may include any suitable number of nodes 306 and any suitable number of lines 304 of k4 structures. FIG. 3B illustrates an example of the graph 302. As seen in FIG. 3B, the graph 302 includes multiple lines 304 of k4 structures. Additionally, the nodes 306 at the ends of the lines 304 of k4 structures may connect to other nodes 306 at the ends of other lines 304 of k4 structures to form subgraphs with those nodes 306. The technique described in the present disclosure applies to the graph 302 regardless of the number of lines 304 of k4 structure in the graph 302 and the size of the subgraphs formed by the nodes 306 at the ends of the lines 304 of k4 structures.

FIGS. 4 through 10 illustrate an example of circuit reduction. A computer system (e.g., the computer system 2400 shown in FIG. 24) may perform the circuit reduction. Generally, during circuit reduction, k4 structures 202 are identified in a graph 302 representing the circuit design 100. A line 304 of k4 structures 202 may be identified by identifying k4 structures 202 that share pairs of connected nodes 306. The line 304 of k4 structures 202 are then removed from the graph 302, and the remaining nodes 306 are connected to each other to form the smaller reduced graph 308. For clarity, not all of the nodes 306 in the examples of FIGS. 4 through 10 have been labeled.

Figure 4:
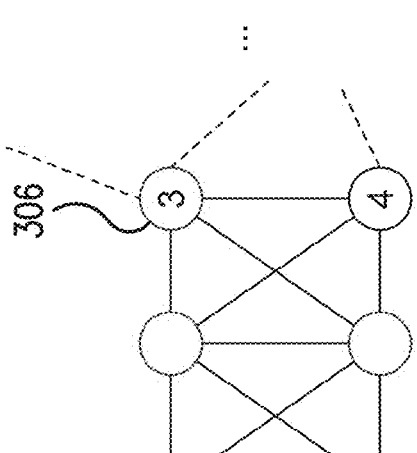
FIG. 4 illustrates an example node identification.
Figure 4:
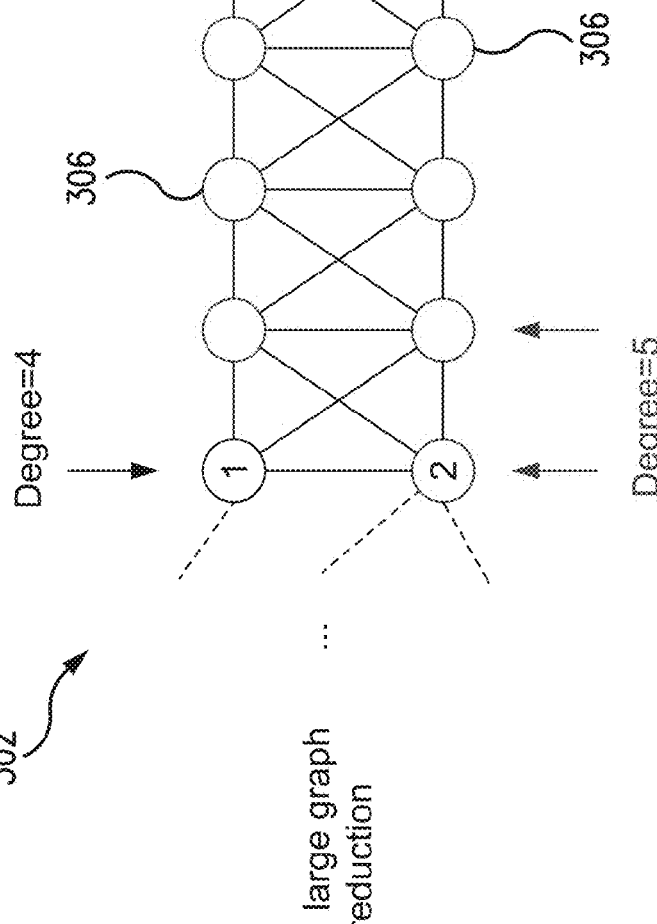

FIG. 4 illustrates an example node identification in a graph 302 representing a circuit design. Specifically, the nodes 306 with a degree of five are identified. The degree of a node 306 indicates the number of nodes 306 connected to that node 306 in the graph 302. In the example of FIG. 4, the nodes 306 labeled 1 and 4 have a degree of four and all other nodes 306 have a degree of five.

Figure 5:
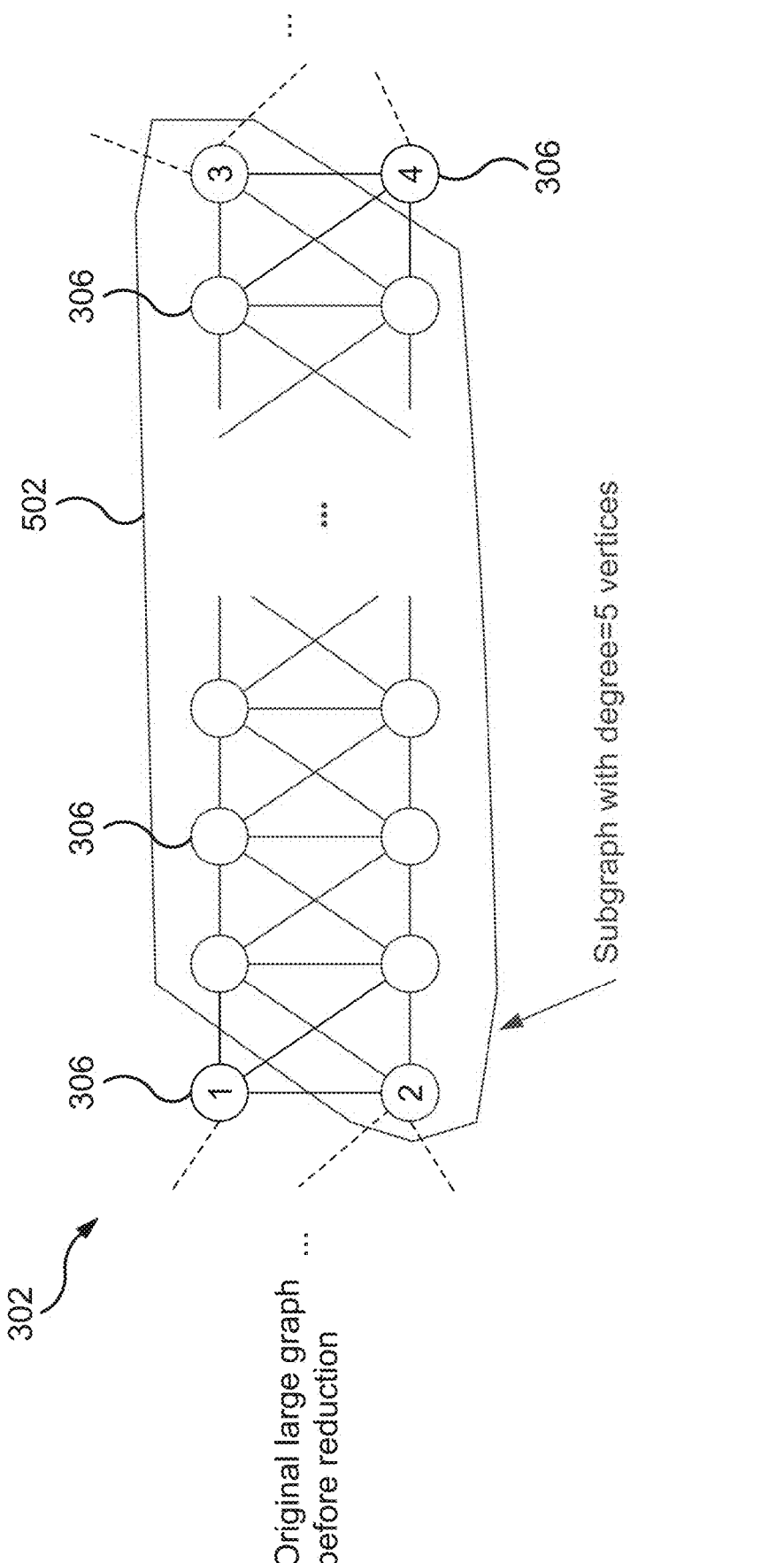
FIG. 5 illustrates an example subgraph identification.

FIG. 5 illustrates an example subgraph identification. As shown in FIG. 5, the subgraph 502 includes the nodes 306 with a degree of five that were identified in the example of FIG. 4. If the number of nodes 306 in the subgraph 502 is less than a threshold (e.g., four nodes), then there may be no benefit to performing the circuit reduction process and the circuit reduction process may not proceed. If the number of nodes 306 in the subgraph 502 exceeds the threshold, then there may be a benefit to performing the circuit reduction process and the circuit reduction process may proceed.

Figure 6:
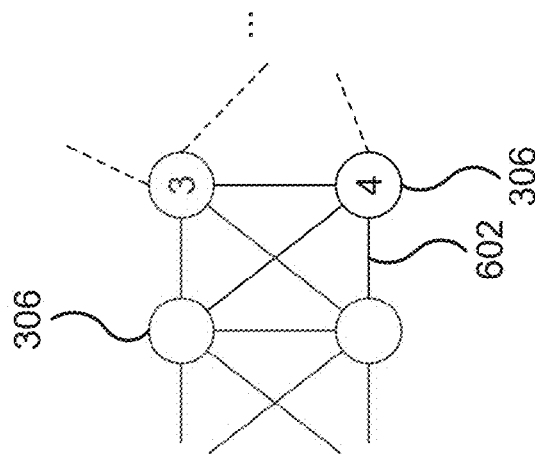
FIG. 6 illustrates example k4 structures.
Figure 6:
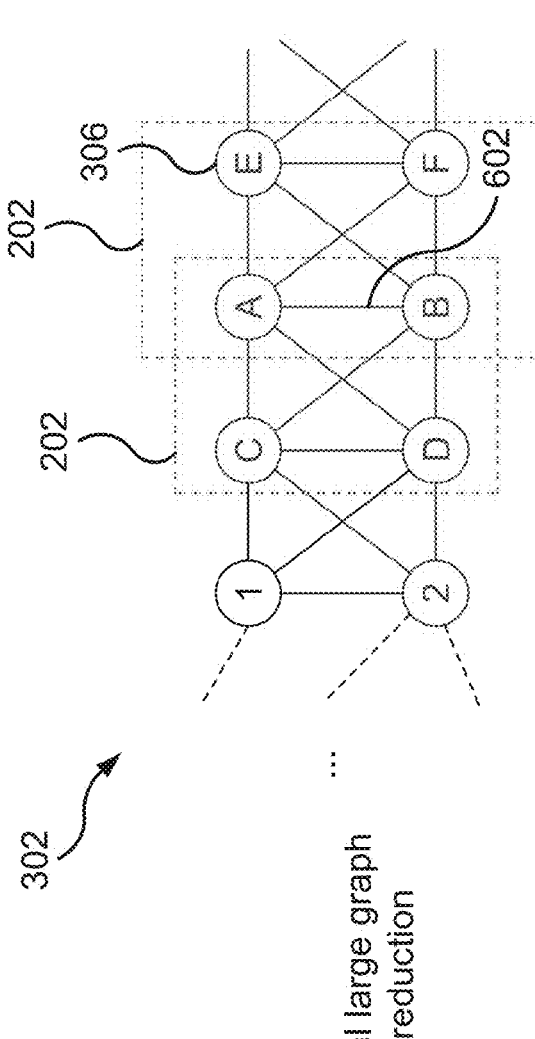

FIG. 6 illustrates example k4 structures 202 identified in the graph 302. For each subgraph 502 (e.g., subgraph 502 with nodes with a degree of five), the computer system identifies an edge 602 that connects a pair of nodes. In the example of FIG. 6, the edge 602 connecting the nodes 306 labeled A and B is identified. Then, the nodes 306 neighboring the nodes A and B are checked to see if they form a k4 structure 202 with the nodes A and B (e.g., a structure of four nodes 306 in which every node 306 is connected to every other node 306). The nodes 306 labeled C and D form one k4 structure 202 with nodes A and B, and the nodes 306 labeled E and F form another k4 structure 202 with the nodes A and B. As a result, the nodes A and B are considered to form a k4 node pair, the nodes C and D form a k4 node pair, and the nodes E and F form a k4 node pair. If in a subgraph 502, there is no k4 node pair, then the subgraph 502 is not reducible through the circuit reduction process, and the circuit reduction process may terminate.

Figure 7:
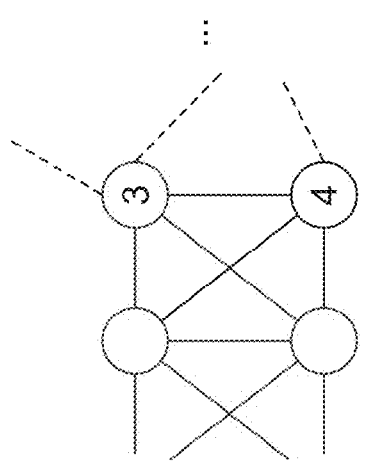
FIG. 7 illustrates an example k4 node pair identification.
Figure 7:
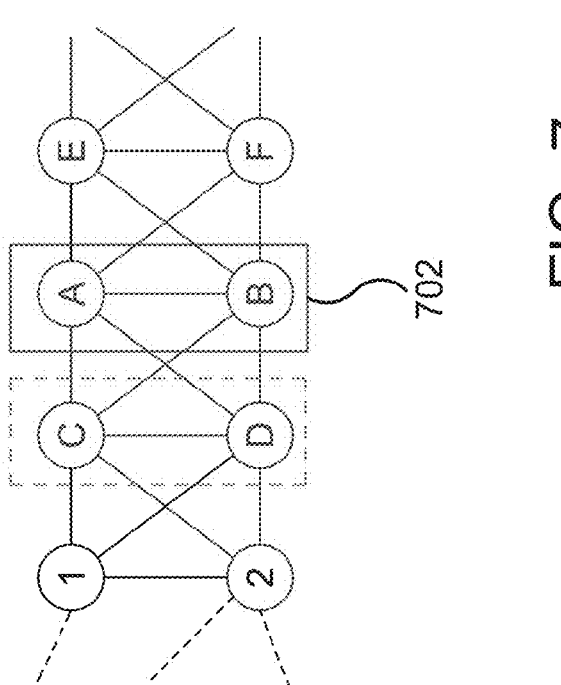

FIG. 7 illustrates an example k4 node pair identification. Starting with the initial node pair (nodes A and B in the example of FIG. 6), the process moves to the left and the right to determine whether the node pairs to the left and the right of the initial node pair (e.g., nodes C and D and nodes E and F) form a k4 structure 202 with the initial node pair. If so, these node pairs are added to a k4 line structure 702 with the nodes A and B. Because the nodes C and D form a k4 structure 202 with the nodes A and B and because the nodes E and F form a k4 structure 202 with the nodes A and B, the nodes A, B, C, D, E, and F are added to a k4 line structure 702. This process then continues to determine whether the next set of node pairs form a k4 structure 202 with another node pair in the k4 line structure 702. If so, those node pairs are added to the k4 line structure 702. This process continues until the ends of the graph 302 (nodes 1 and 2 and nodes 3 and 4) are reached or evaluated.

Figure 8:
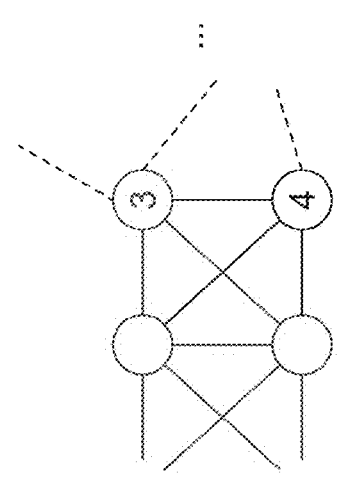
FIG. 8 illustrates an example k4 line structure.
Figure 8:
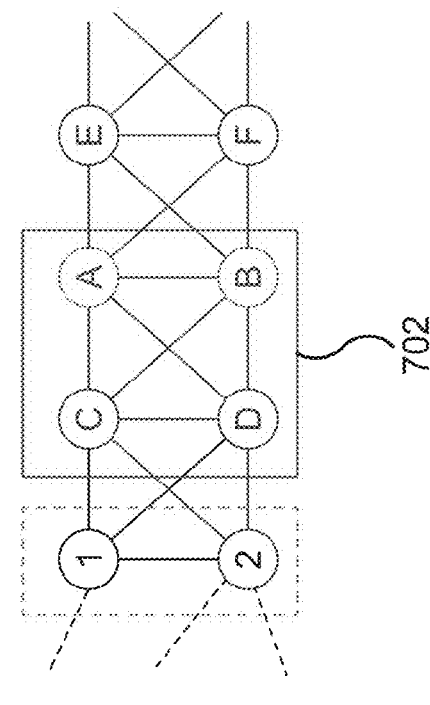
Figure 8:
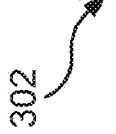

FIG. 8 illustrates an example k4 line structure 702. In the example of FIG. 8, the nodes 1 and 2 are evaluated and determined to form a k4 structure with the nodes C and D. Thus, the nodes 1 and 2 are added to the k4 line structure.

Figure 9:
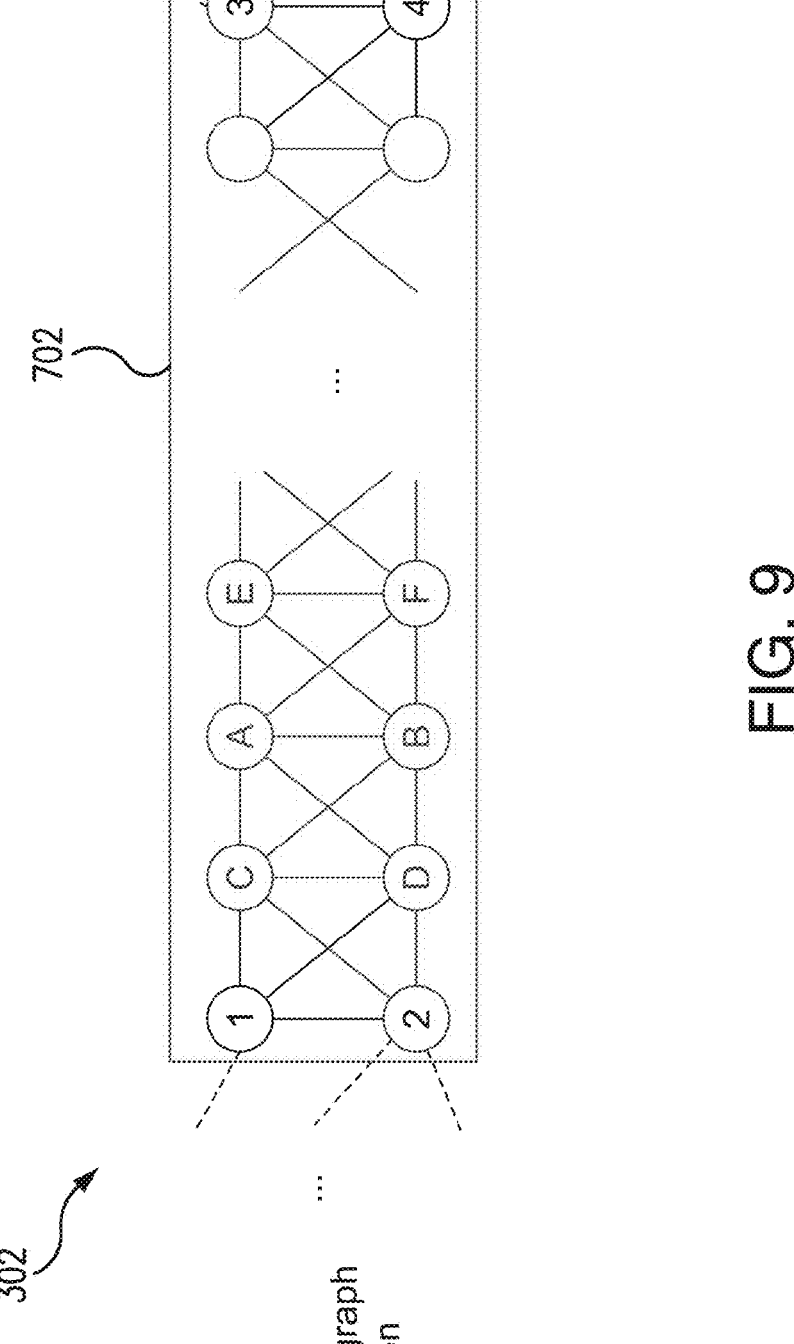
FIG. 9 illustrates an example k4 line structure.

FIG. 9 illustrates an example k4 line structure 702. As seen in FIG. 9, the k4 line structure 702 includes all of the nodes in the shown part of the graph 302, because each of the node pairs forms a k4 structure 202 with an adjacent node pair.

Figure 10:
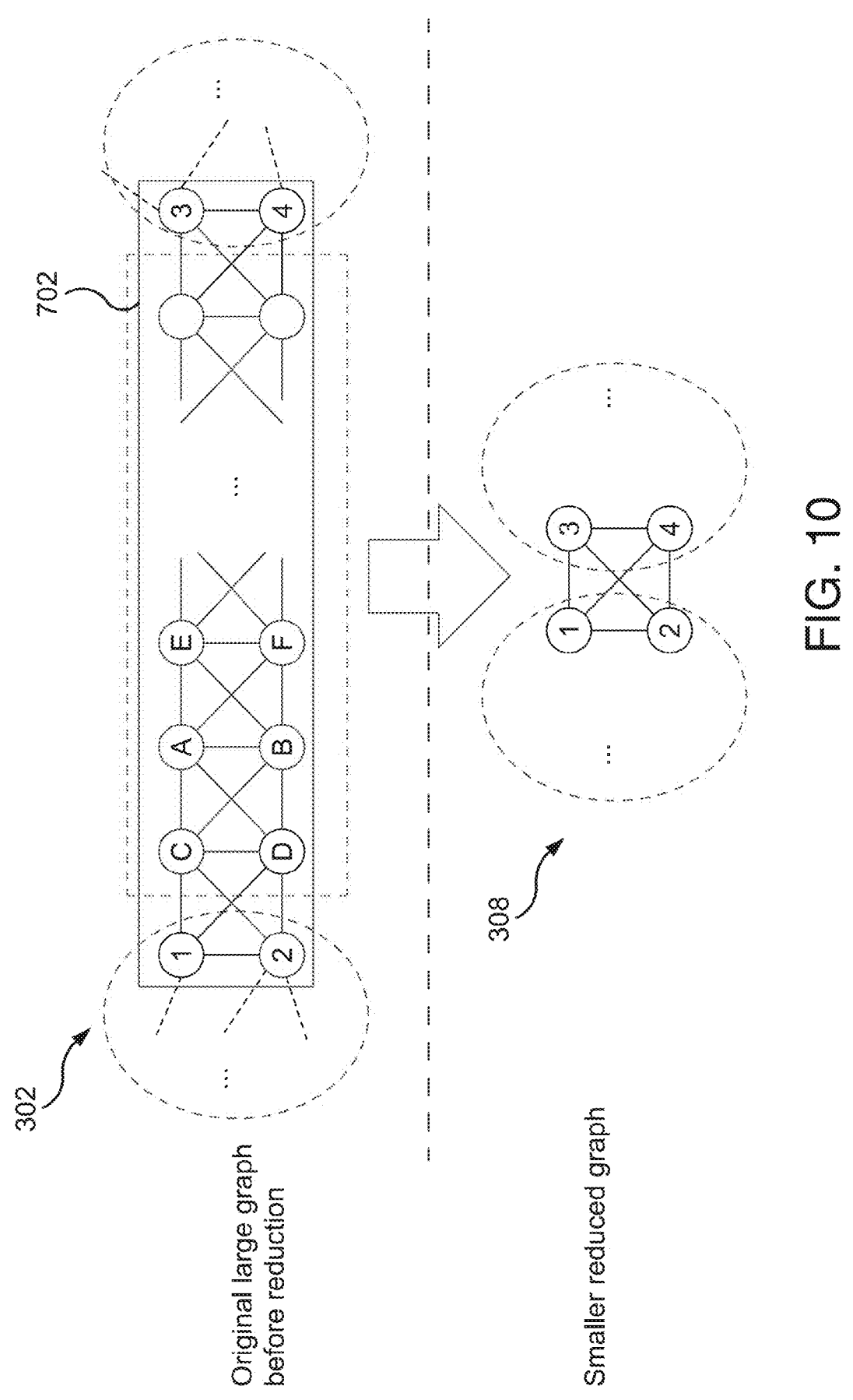
FIG. 10 illustrates an example circuit design reduction.

FIG. 10 illustrates an example graph or circuit design reduction. During the circuit design reduction, the k4 line structure 702 is analyzed to see which node pairs may be removed from the graph 302 or the circuit design to form a reduced node structure or a reduced graph 308. During the reduction, an even number of the node pairs in the k4 line structure 702, except the two node pairs at the ends of the k4 line structure 702, may be removed. In the example of FIG. 10, there are an even number of node pairs between the nodes 1 and 2 and the nodes 3 and 4, so all of those node pairs may be removed. If there had been an odd number of node pairs, then only an even number of them would be removed (e.g., leaving one node pair between the nodes 1 and 2 and the nodes 3 and 4). After the even number of node pairs are removed, the remaining node pairs are connected to form the reduced node structure or the reduced graph 308. In the example of FIG. 10, because all of the node pairs between the nodes 1 and 2 and the nodes 3 and 4 are removed, the nodes 1 and 2 and the nodes 3 and 4 are connected to form the reduced node structure or the reduced graph 308. In the reduced graph 308, each of the nodes 1, 2, 3, and 4 is connected to each of the other nodes 1, 2, 3, and 4.

Figure 11:
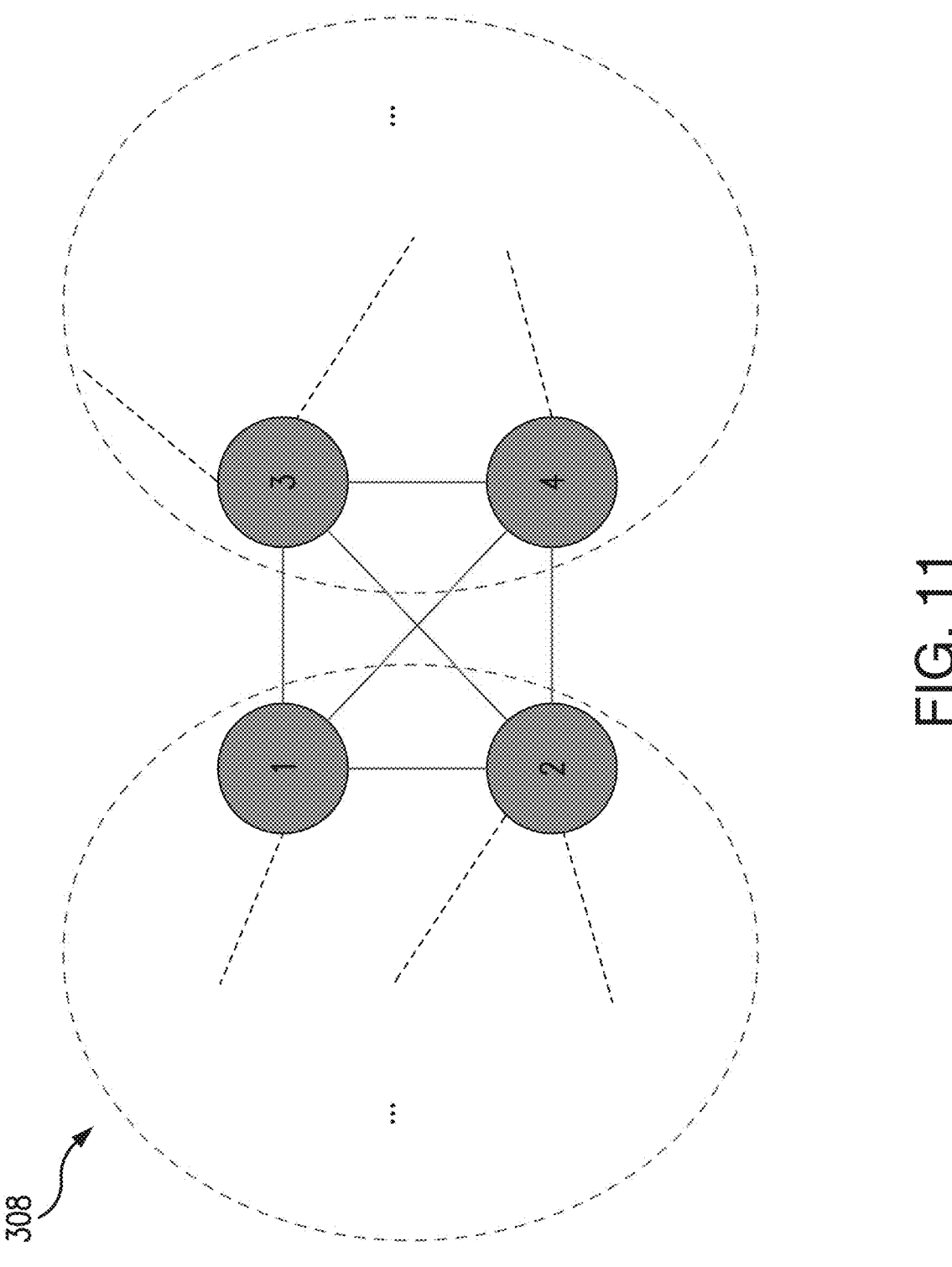
FIG. 11 illustrates an example layer assignment.

The reduced node structure or reduced graph 308 is then sent through a software program to assign the nodes of the reduced node structure or the reduced graph 308 to layers. FIGS. 11 through 14 show example layer assignments for the reduced node structure. FIG. 11 illustrates an example layer assignment. In the example of FIG. 11, the nodes 1, 2, 3, and 4 in the reduced graph 308 are each assigned to the same layer (indicated by the color green). As a result, there are six conflicts between the four nodes (indicated by red edges). Each conflict indicates that adjacent or connected nodes are assigned to the same layer.

Figures 12A, 12B, 12C:
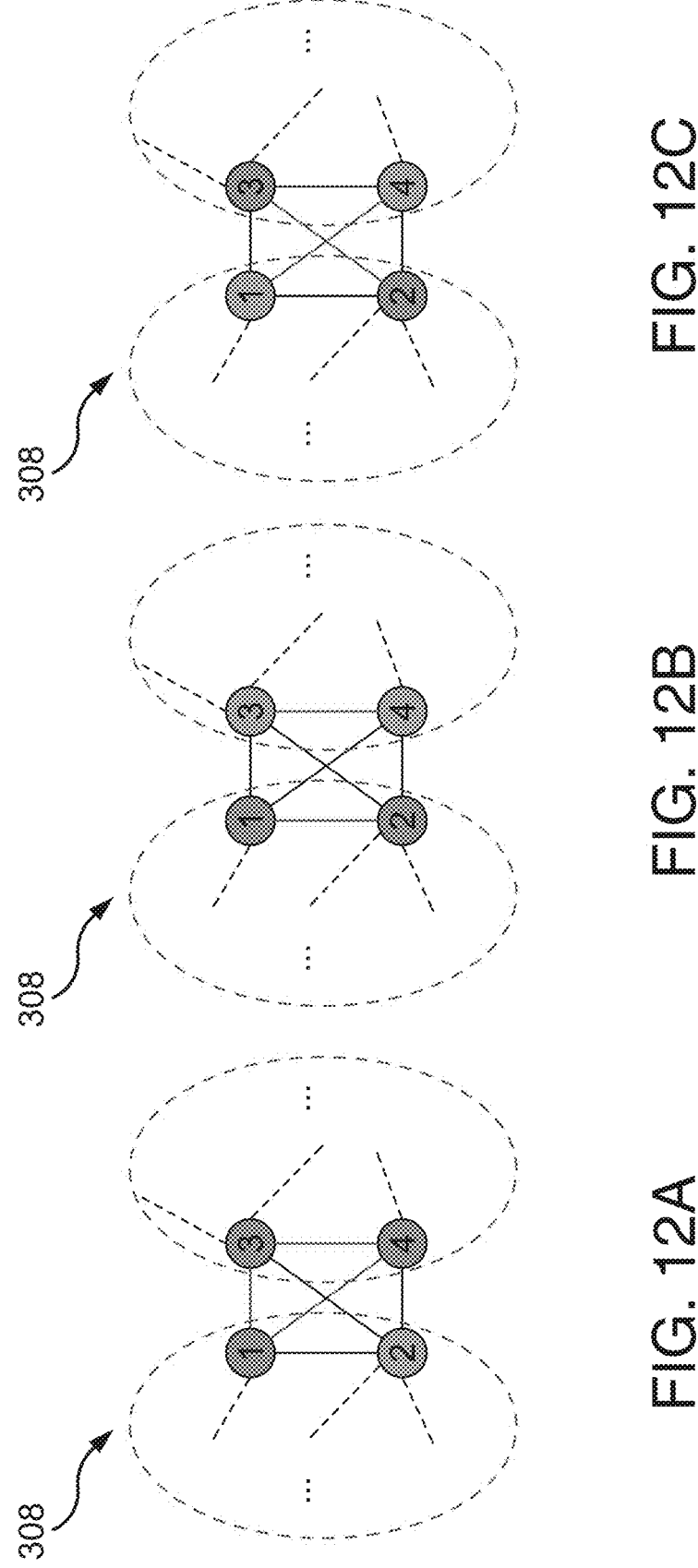
FIGS. 12A, 12B, and 12C illustrate example layer assignments.

FIGS. 12A, 12B, and 12C illustrates example layer assignments. In the examples of FIGS. 12A, 12B, and 12C, the nodes 1, 2, 3, and 4 in the reduced graph 308 are assigned to two different layers (indicated by the colors green and blue). In a first assignment shown in FIG. 12A, three of the nodes (nodes 1, 3, and 4) are assigned to the same layer (indicated by the color green) and one node (node 2) is assigned to a different layer (indicated by the color blue). As a result, there are three conflicts (indicated by red edges) in this assignment (e.g., between node 1 and node 3, between node 1 and node 4, and between node 3 and node 4). In a second assignment shown in FIG. 12B, two of the nodes (nodes 1 and 2) are assigned to one layer (indicated by the green color) and the other two nodes (nodes 3 and 4) are assigned to another layer (indicated by the blue color). As a result, there are two conflicts (indicated by red edges) in this assignment (e.g., between node 1 and node 2 and between node 3 and node 4). In a third assignment shown in FIG. 12C, two of the nodes (nodes 2 and 3) are assigned to one layer (indicated by the color green) and the other two nodes (nodes 1 and 4) are assigned to another layer (indicated by the color blue). As a result, there are two conflicts (indicated by red edges) in this assignment (e.g., between node 1 and node 4 and between node 2 and node 3).

Figure 13B:
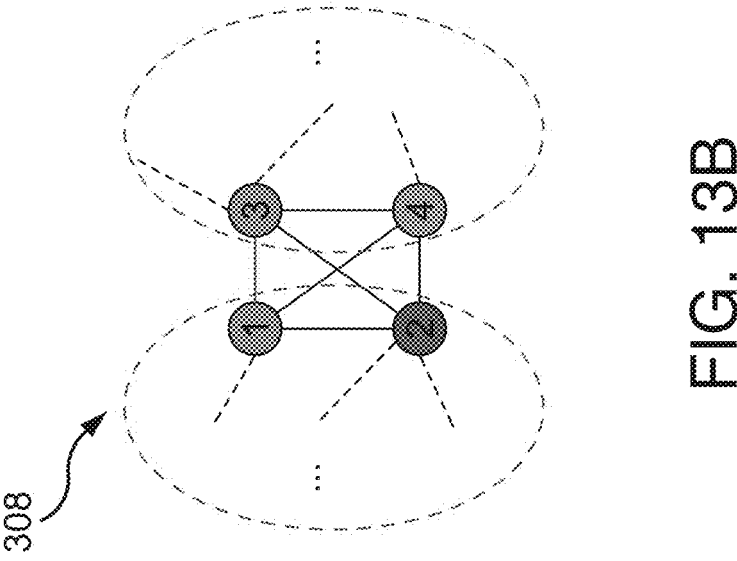
FIGS. 13A and 13B illustrate example layer assignments.
Figure 13A:
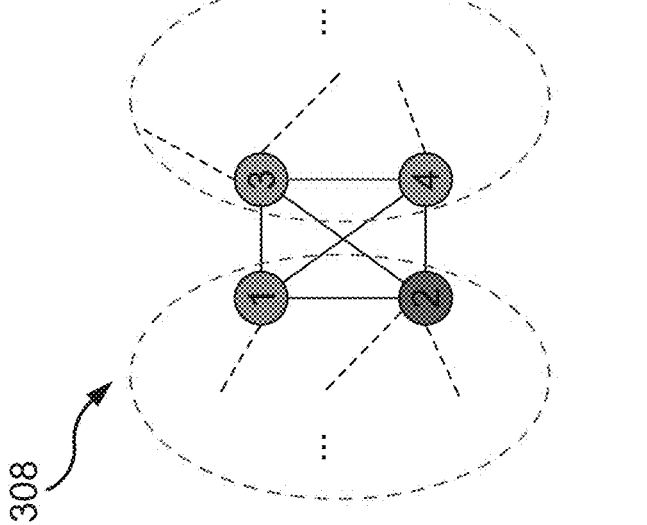

FIGS. 13A and 13B illustrates example layer assignments. In the example of FIGS. 13A and 13B, the nodes 1, 2, 3, and 4 in the reduced graph 308 are assigned to three different layers (indicated by the colors green, blue, and orange). In a first assignment shown in FIG. 13A, one node (node 1) is assigned to a first layer (indicated by the color green), another node (node 2) is assigned to a second layer (indicated by the color blue), and two nodes (nodes 3 and 4) are assigned to a third layer (indicated by the color orange). As a result, there is one conflict (indicated by the red edge) in this assignment (e.g., between node 3 and node 4). In a second assignment shown in FIG. 13B, two nodes (nodes 1 and 3) are assigned to a first layer (indicated by the color green), one node (node 2) is assigned to a second layer (indicated by the color blue), and one node (node 4) is assigned to a third layer (indicated by the color orange). As a result, there is one conflict (indicated by the red edge) in this assignment (e.g., between node 1 and node 3).

Figure 14:
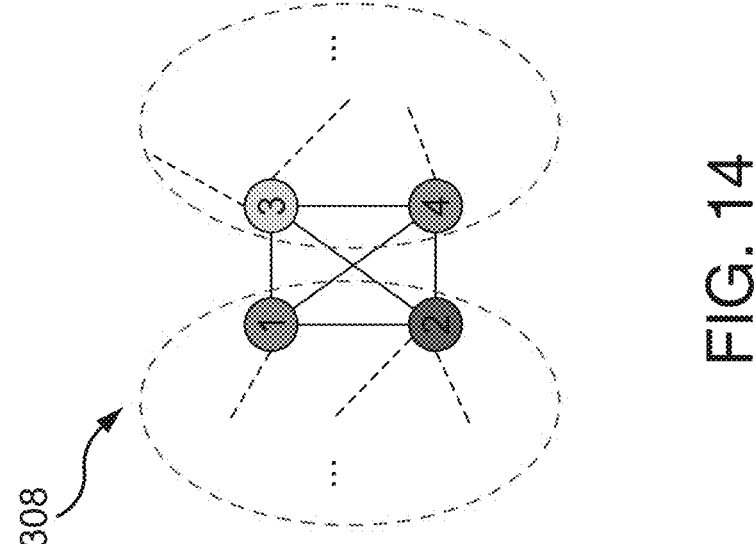
FIG. 14 illustrates an example layer assignment.

FIG. 14 illustrates an example layer assignment. In the example of FIG. 14, the nodes 1, 2, 3, and 4 in the reduced graph 308 are assigned to four different layers (indicated by the colors green, blue, orange, and yellow). Node 1 is assigned to a first layer (indicated by the color green). Node 2 is assigned to a second layer (indicated by the color blue). Node 3 is assigned to a third layer (indicated by the color yellow). Node 4 is assigned to a fourth node (indicated by the color orange). Because each of the nodes 1, 2, 3, and 4 is assigned to a different layer, there are no conflicts in this assignment.

After the nodes of the reduced node structure or reduced graph 308 are assigned to layers, the nodes in the k4 line structure 702 that were removed to form the reduced node structure or reduced graph 308 can be quickly assigned to layers. As discussed previously, in this example, the k4 line structure 702 has two ends, and the nodes 1, 2, 3, and 4 at the two ends of the k4 line structure 702 were not removed. The assignment for the nodes k4 line structure 702 that were removed can be done by following these rules:

Rule 1: If any one end (e.g., nodes 1 and 2 or nodes 3 and 4) is a node pair assigned to two different layers (e.g., two different colors), begin assigning layers from this end and move towards the other end. If both ends have node pairs assigned to the same layers (e.g., same color), or both ends have a node pair assigned to the different layers (e.g., two different colors), randomly select an end to start the layer assignment.

Rule 2: When assigning layers for a pair of nodes, assign the two nodes to two different layers (different colors), and these two layers are also different from the layers assigned to the nodes in the previous node pair in the k4 line structure 702 (e.g., moving in the direction determined in Rule 1).

Rule 3: When starting assignment from one end of the k4 line structure 702 and when Rule 2 is satisfied, the two layers assigned to the nodes of the first node pair (e.g., the node pair closest to an end of the k4 line structure 702) should include as many layers of the node pair at the other end of the k4 line structure 702 as possible. If there are multiple layer choices satisfying all the rules, then any of the layers is equally good.

With above three rules, no new layer conflicts are introduced when assigning layers to the removed nodes, in certain embodiments. The final result has an equal or less number of conflicts as the reduced node structure or reduced graph 308. FIGS. 15 through 21 illustrate examples of assigning layers to the removed nodes 306. For clarity, not all of the nodes 306 are labeled in FIGS. 15 through 21.

Figure 15:
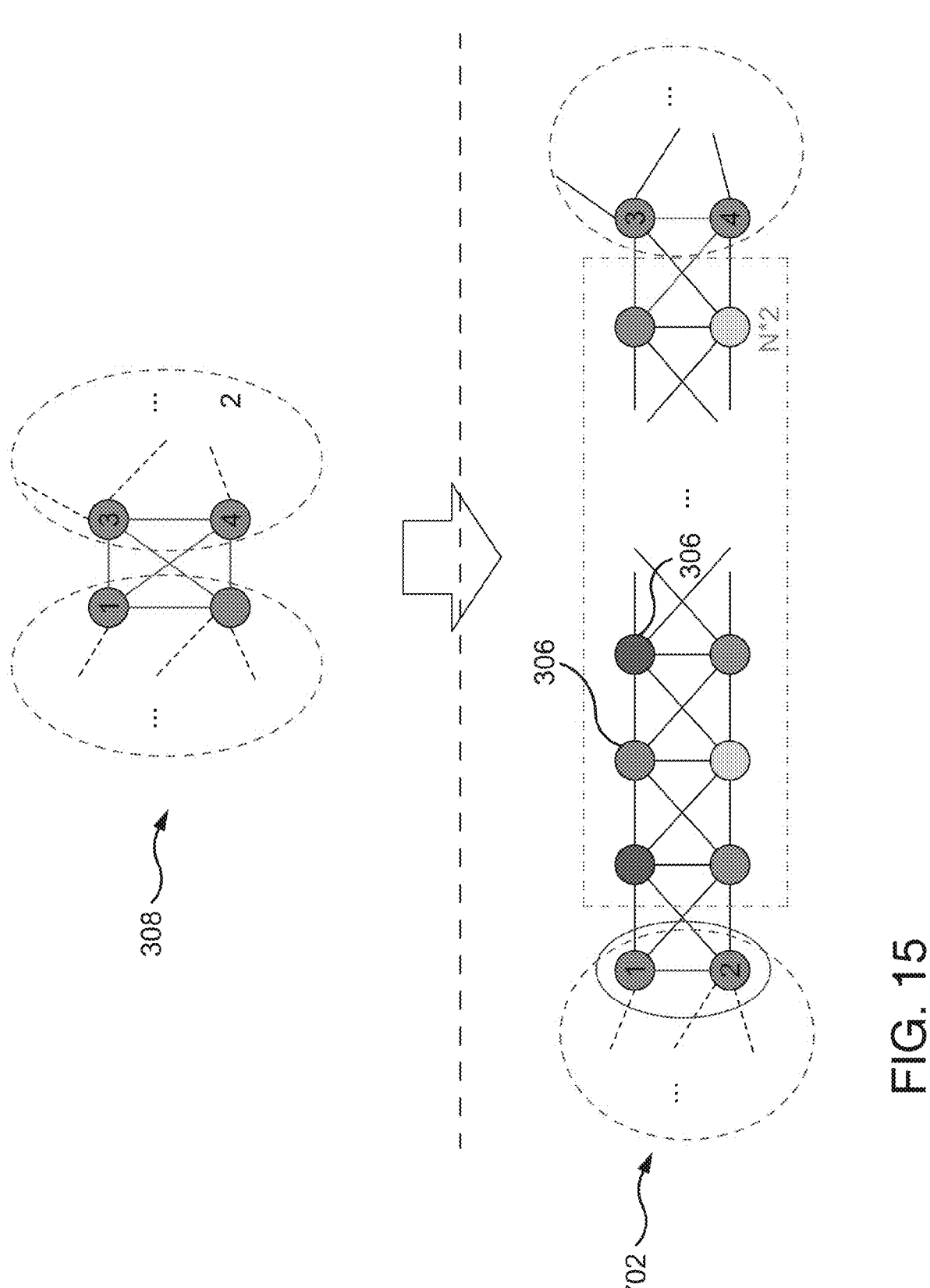
FIG. 15 illustrates an example layer assignment.

FIG. 15 illustrates an example layer assignment. The example of FIG. 15 shows one example result of following the three rules when the nodes 1, 2, 3, and 4 of the reduced node structure or reduced graph 308 are assigned to the same layer. As seen in FIG. 15, the resultant layer assignment yields fewer conflicts (four conflicts) than in the reduced node structure (six conflicts).

To begin, because the nodes 1, 2, 3, and 4 are assigned to the same layer (indicated by the color green), Rule 1 indicates that assignment can start from either end. In the example of FIG. 15, assignment begins from the left end at nodes 1 and 2. According to Rule 2, the first pair of nodes 306 after the nodes 1 and 2 are assigned to different layers, which are also different from the layer assigned to the nodes 1 and 2. Thus, the first pair of nodes 306 is assigned to a second layer (indicated by the color blue) and a third layer (indicated by the color orange). According to Rule 3, as many nodes 306 of this first pair of nodes 306 should be assigned to the first layer (indicated by the color green) because the nodes 3 and 4 at the opposite end of the k4 line structure 702 are both assigned to the first layer (indicated by the color green). Because nodes 1 and 2 are also assigned to the first layer (indicated by the color green), however, none of the first pair nodes 306 is assigned to the first layer (indicated by the color green) or Rule 2 would be violated.

The assignment process then proceeds to the second pair of nodes 306 to the right of the first pair of nodes 306. According to Rule 2, the second pair of nodes 306 should be assigned to different layers, which are also different from the layers assigned to the first pair of nodes 306. As a result, the second pair of nodes 306 is assigned to the first layer (indicated by the color green) and a fourth layer (indicated by the color yellow). This process continues until the end of the k4 line structure 702 with the nodes 3 and 4 is reached. As seen in FIG. 15, the assignment process results in four conflicts (indicated by red edges), which is fewer than the six conflicts in the reduced graph 308.

Figure 16:
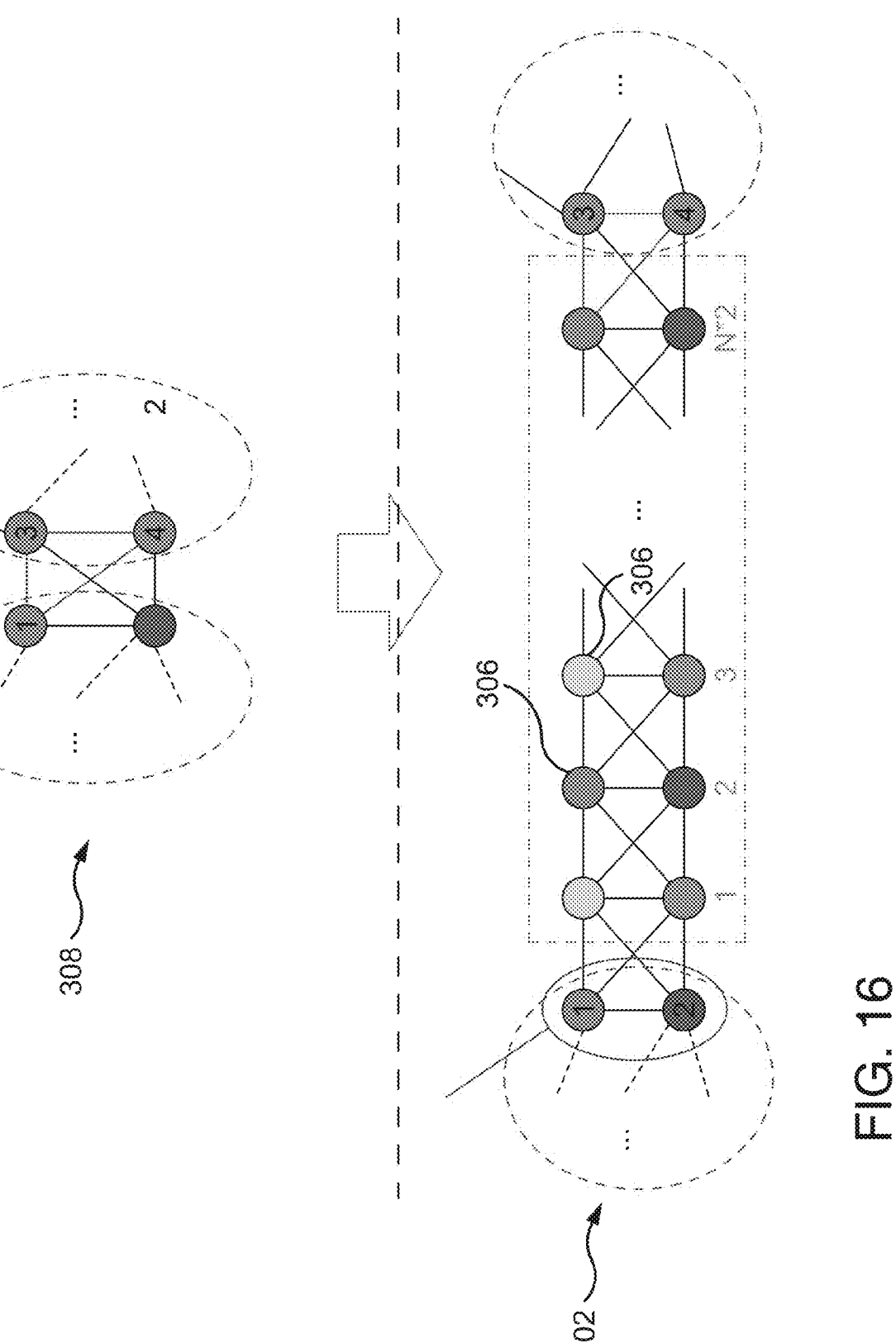
FIG. 16 illustrates an example layer assignment.

FIG. 16 illustrates an example layer assignment. The example of FIG. 16 shows one example result of following the three rules when the nodes 1, 2, 3, and 4 of the reduced node structure or the reduced graph 308 are assigned to two layers. As seen in FIG. 16, the resultant layer assignment yields the same number of conflicts (three conflicts) as the reduced node structure or reduced graph 308.

To begin, because the nodes 1 and 2 are assigned to different layers (indicated by the colors green and blue) and the nodes 3 and 4 are assigned to the same layer (indicated by the color green), Rule 1 indicates that assignment should start from the end with nodes 1 and 2. According to Rule 2, the first pair of nodes 306 after the nodes 1 and 2 are assigned to different layers, which are also different from the layers assigned to the nodes 1 and 2. Thus, the first pair of nodes 306 is assigned to a third layer (indicated by the color yellow) and a fourth layer (indicated by the color orange). According to Rule 3, as many nodes 306 of this first pair of nodes 306 should be assigned to the first layer (indicated by the color green) because the nodes 3 and 4 at the opposite end of the k4 line structure 702 are both assigned to the first layer (indicated by the color green). Because node 1 is also assigned to the first layer (indicated by the color green), however, none of the first pair nodes 306 is assigned to the first layer (indicated by the color green) or Rule 2 would be violated.

The assignment process then proceeds to the second pair of nodes 306 to the right of the first pair of nodes 306.

According to Rule 2, the second pair of nodes 306 should be assigned to different layers, which are also different from the layers assigned to the first pair of nodes 306. As a result, the second pair of nodes 306 is assigned to the first layer (indicated by the color green) and the second layer (indicated by the color blue). This process continues until the end of the k4 line structure 702 with the nodes 3 and 4 is reached. As seen in FIG. 16, the assignment process results in three conflicts (indicated by red edges), which is equal to the three conflicts in the reduced graph 308.

Figure 17:
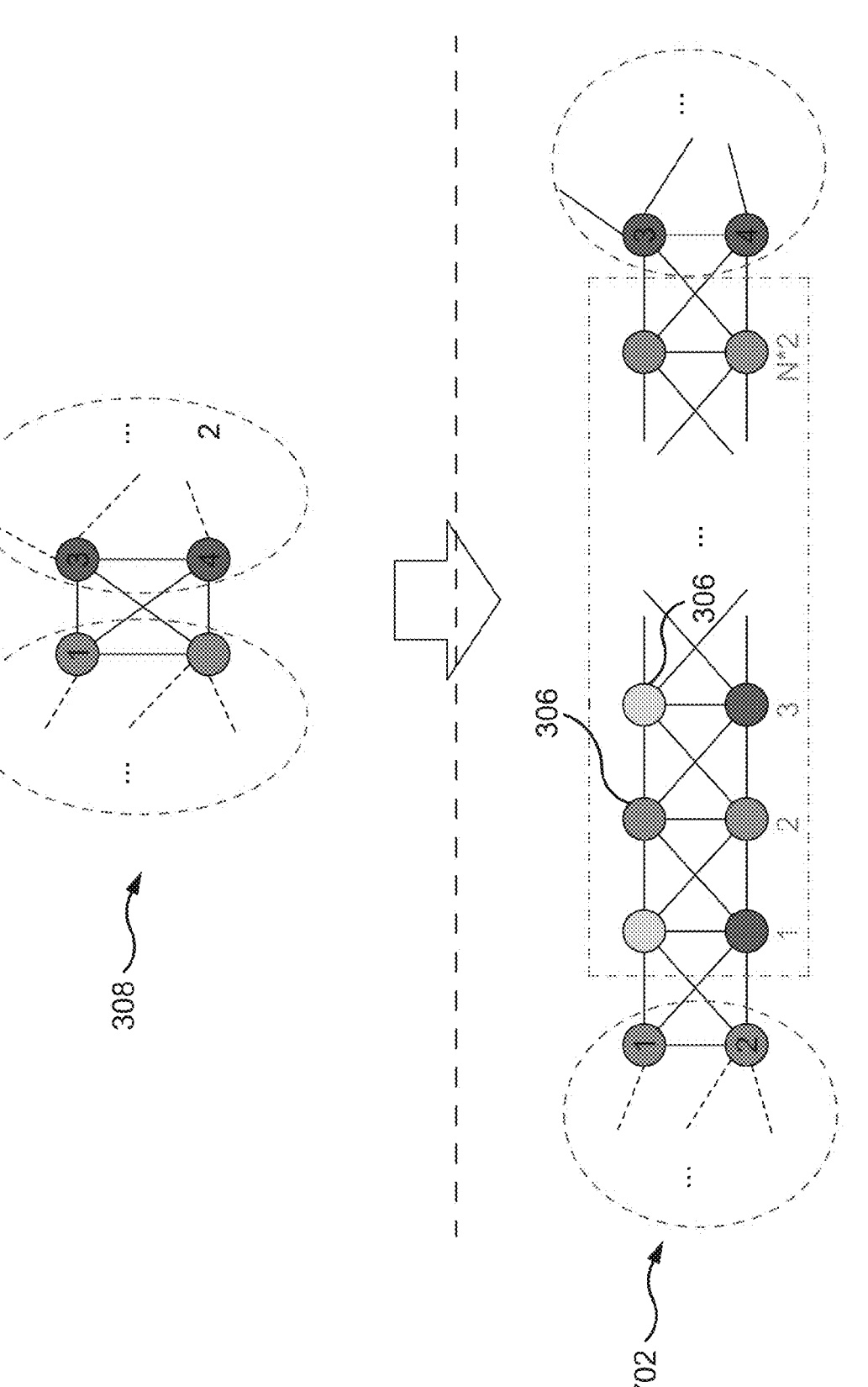
FIG. 17 illustrates an example layer assignment.

FIG. 17 illustrates an example layer assignment. The example of FIG. 17 shows one example result of following the three rules when the nodes 1, 2, 3, and 4 of the reduced node structure or reduced graph 308 are assigned to two layers. As seen in FIG. 17, the resultant layer assignment yields the same number of conflicts (two conflicts) as the reduced node structure or reduced graph 308.

To begin, because the nodes 1 and 2 are assigned to the same layers (indicated by the color green) and the nodes 3 and 4 are assigned to the same layer (indicated by the color blue), Rule 1 indicates that assignment can start from either end. In the example of FIG. 17, assignment begins from the left end at nodes 1 and 2. According to Rule 2, the first pair of nodes 306 after the nodes 1 and 2 are assigned to different layers, which are also different from the layer assigned to the nodes 1 and 2. According to Rule 3, as many nodes 306 of this first pair of nodes 306 should be assigned to the second layer (indicated by the color blue) because the nodes 3 and 4 at the opposite end of the k4 line structure 702 are both assigned to the second layer (indicated by the color blue). Because nodes 1 and 2 are not assigned to the second layer (indicated by the color blue), one of the first pair of nodes 306 is assigned to the second layer (indicated by the color blue) and the other is assigned to a third layer (indicated by the color yellow).

The assignment process then proceeds to the second pair of nodes 306 to the right of the first pair of nodes 306. According to Rule 2, the second pair of nodes 306 should be assigned to different layers, which are also different from the layers assigned to the first pair of nodes 306. As a result, the second pair of nodes 306 is assigned to the first layer (indicated by the color green) and a fourth layer (indicated by the color orange). This process continues until the end of the k4 line structure 702 with the nodes 3 and 4 is reached. As seen in FIG. 17, the assignment process results in two conflicts (indicated by red edges), which is equal to the two conflicts in the reduced graph 308.

Figure 18:
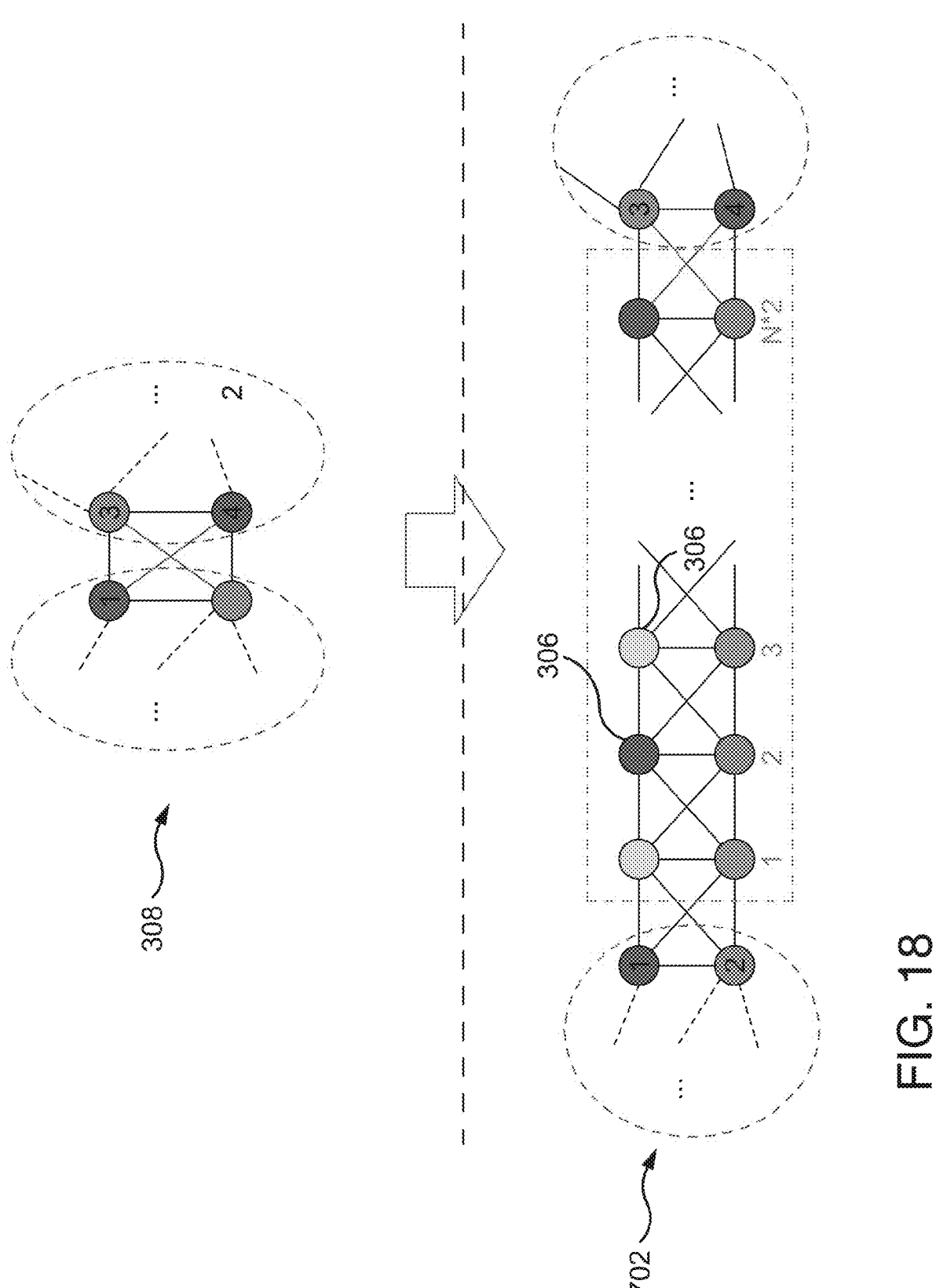
FIG. 18 illustrates an example layer assignment.

FIG. 18 illustrates an example layer assignment. The example of FIG. 18 shows one example result of following the three rules when the nodes 1, 2, 3, and 4 of the reduced node structure or reduced graph 308 are assigned to two layers. As seen in FIG. 18, the resultant layer assignment yields the same number of conflicts (two conflicts) as the reduced node structure or reduced graph 308.

To begin, because the nodes 1 and 2 are assigned to different layers (indicated by the colors green and blue) and the nodes 3 and 4 are assigned to the different layers (indicated by the colors green and blue), Rule 1 indicates that assignment can start from either end. In the example of FIG. 18, assignment begins from the left end at nodes 1 and 2. According to Rule 2, the first pair of nodes 306 after the nodes 1 and 2 are assigned to different layers, which are also different from the layers assigned to the nodes 1 and 2. Thus, the first pair of nodes 306 is assigned to a third layer (indicated by the color yellow) and a fourth layer (indicated by the color orange). According to Rule 3, as many nodes 306 of this first pair of nodes 306 should be assigned to the first layer (indicated by the color green) and the second layer (indicated by the color blue) because the nodes 3 and 4 at the opposite end of the k4 line structure 702 are assigned to the first layer (indicated by the color green) and the second layer (indicated by the color blue). Because nodes 1 and 2 are also assigned to the first layer (indicated by the color green) and the second layer (indicated by the color blue), however, none of the first pair nodes 306 is assigned to the first or second layers (indicated by the colors green and blue) or Rule 2 would be violated.

The assignment process then proceeds to the second pair of nodes 306 to the right of the first pair of nodes 306. According to Rule 2, the second pair of nodes 306 should be assigned to different layers, which are also different from the layers assigned to the first pair of nodes 306. As a result, the second pair of nodes 306 is assigned to the first layer (indicated by the color green) and the second layer (indicated by the color blue). This process continues until the end of the k4 line structure 702 with the nodes 3 and 4 is reached. As seen in FIG. 18, the assignment process results in two conflicts (indicated by red edges), which is equal to the two conflicts in the reduced graph 308.

Figure 19:
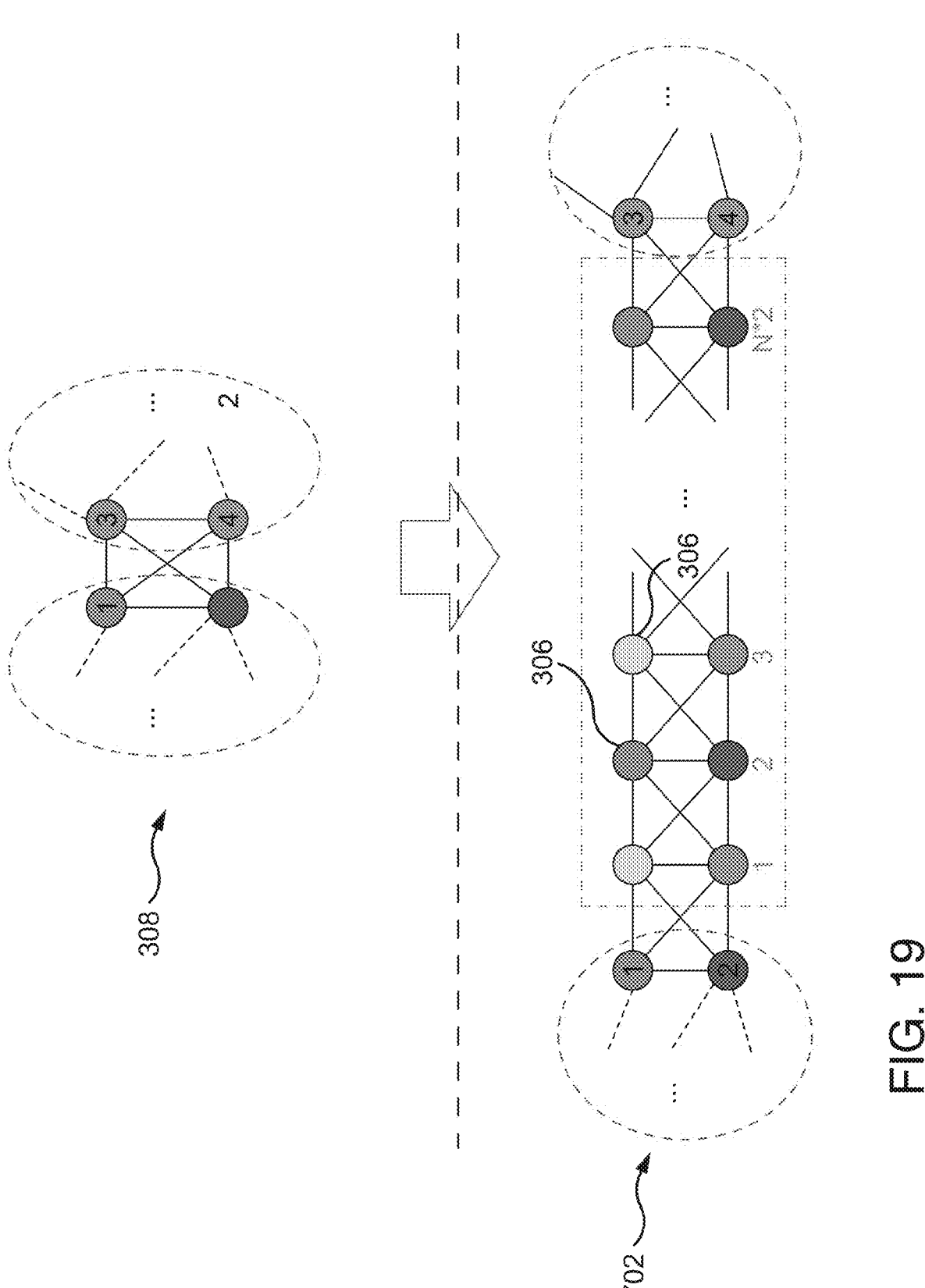
FIG. 19 illustrates an example layer assignment.

FIG. 19 illustrates an example layer assignment. The example of FIG. 19 shows one example result of following the three rules when the nodes 1, 2, 3, and 4 of the reduced node structure or reduced graph 308 are assigned to three layers. As seen in FIG. 19, the resultant layer assignment yields the same number of conflicts (one conflict) as the reduced node structure or reduced graph 308.

To begin, because the nodes 1 and 2 are assigned to the first and second layers (indicated by the colors green and blue) and the nodes 3 and 4 are assigned to the third layer (indicated by the color orange), Rule 1 indicates that assignment should start from the end with nodes 1 and 2. According to Rule 2, the first pair of nodes 306 after the nodes 1 and 2 are assigned to different layers, which are also different from the layers assigned to the nodes 1 and 2. According to Rule 3, as many nodes 306 of this first pair of nodes 306 should be assigned to the third layer (indicated by the color orange) because the nodes 3 and 4 at the opposite end of the k4 line structure 702 are both assigned to the third layer (indicated by the color orange). Because nodes 1 and 2 are not assigned to the third layer (indicated by the color orange), one of the first pair of nodes 306 is assigned to the third layer (indicated by the color orange) and the other is assigned to a fourth layer (indicated by the color yellow).

The assignment process then proceeds to the second pair of nodes 306 to the right of the first pair of nodes 306. According to Rule 2, the second pair of nodes 306 should be assigned to different layers, which are also different from the layers assigned to the first pair of nodes 306. As a result, the second pair of nodes 306 is assigned to the first layer (indicated by the color green) and the second layer (indicated by the color blue). This process continues until the end of the k4 line structure 702 with the nodes 3 and 4 is reached. As seen in FIG. 19, the assignment process results in one conflict (indicated by the red edge), which is equal to the one conflict in the reduced graph 308.

Figure 20:
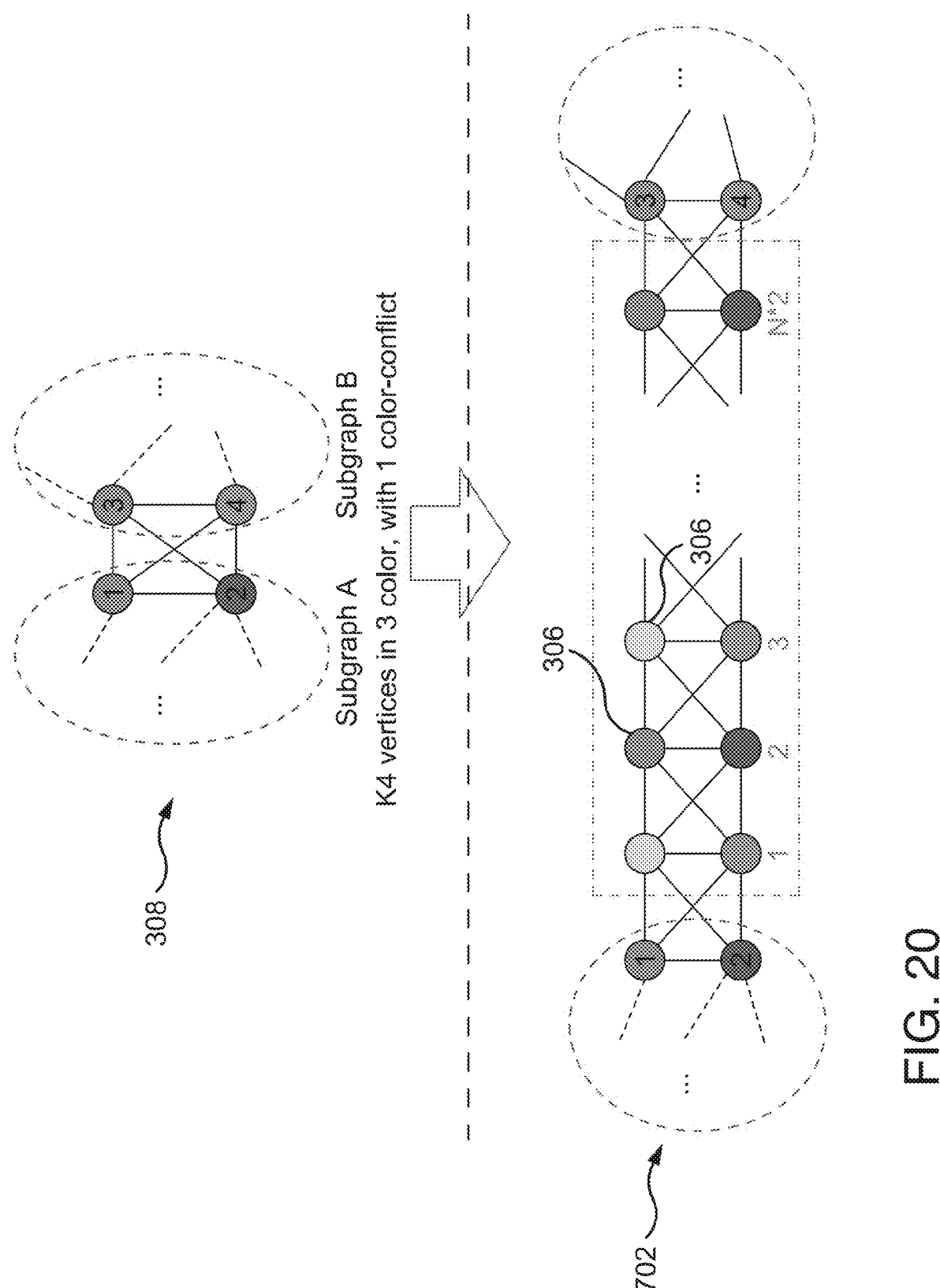
FIG. 20 illustrates an example layer assignment.

FIG. 20 illustrates an example layer assignment. The example of FIG. 20 shows one example result of following the three rules when the nodes 1, 2, 3, and 4 of the reduced node structure or reduced graph 308 are assigned to three layers. As seen in FIG. 20, the resultant layer assignment yields the same number of conflicts (one conflict) as the reduced node structure or reduced graph 308.

To begin, because the nodes 1 and 2 are assigned to the first and second layers (indicated by the colors green and blue) and the nodes 3 and 4 are assigned to the first and third layers (indicated by the colors green and orange), Rule 1 indicates that assignment can start from either end. In the example of FIG. 20, assignment begins from the left end at nodes 1 and 2. According to Rule 2, the first pair of nodes 306 after the nodes 1 and 2 are assigned to different layers, which are also different from the layers assigned to the nodes 1 and 2. According to Rule 3, as many nodes 306 of this first pair of nodes 306 should be assigned to the first and third layers (indicated by the colors green and orange) because the nodes 3 and 4 at the opposite end of the k4 line structure 702 are assigned to the first and third layers (indicated by the colors green and orange). Because nodes 1 and 2 are not assigned to the third layer (indicated by the color orange), one of the first pair of nodes 306 is assigned to the third layer (indicated by the color orange) and the other is assigned to a fourth layer (indicated by the color yellow).

The assignment process then proceeds to the second pair of nodes 306 to the right of the first pair of nodes 306. According to Rule 2, the second pair of nodes 306 should be assigned to different layers, which are also different from the layers assigned to the first pair of nodes 306. As a result, the second pair of nodes 306 is assigned to the first layer (indicated by the color green) and the second layer (indicated by the color blue). This process continues until the end of the k4 line structure 702 with the nodes 3 and 4 is reached. As seen in FIG. 20, the assignment process results in one conflict (indicated by red edge), which is equal to the one conflict in the reduced graph 308.

Figure 21:
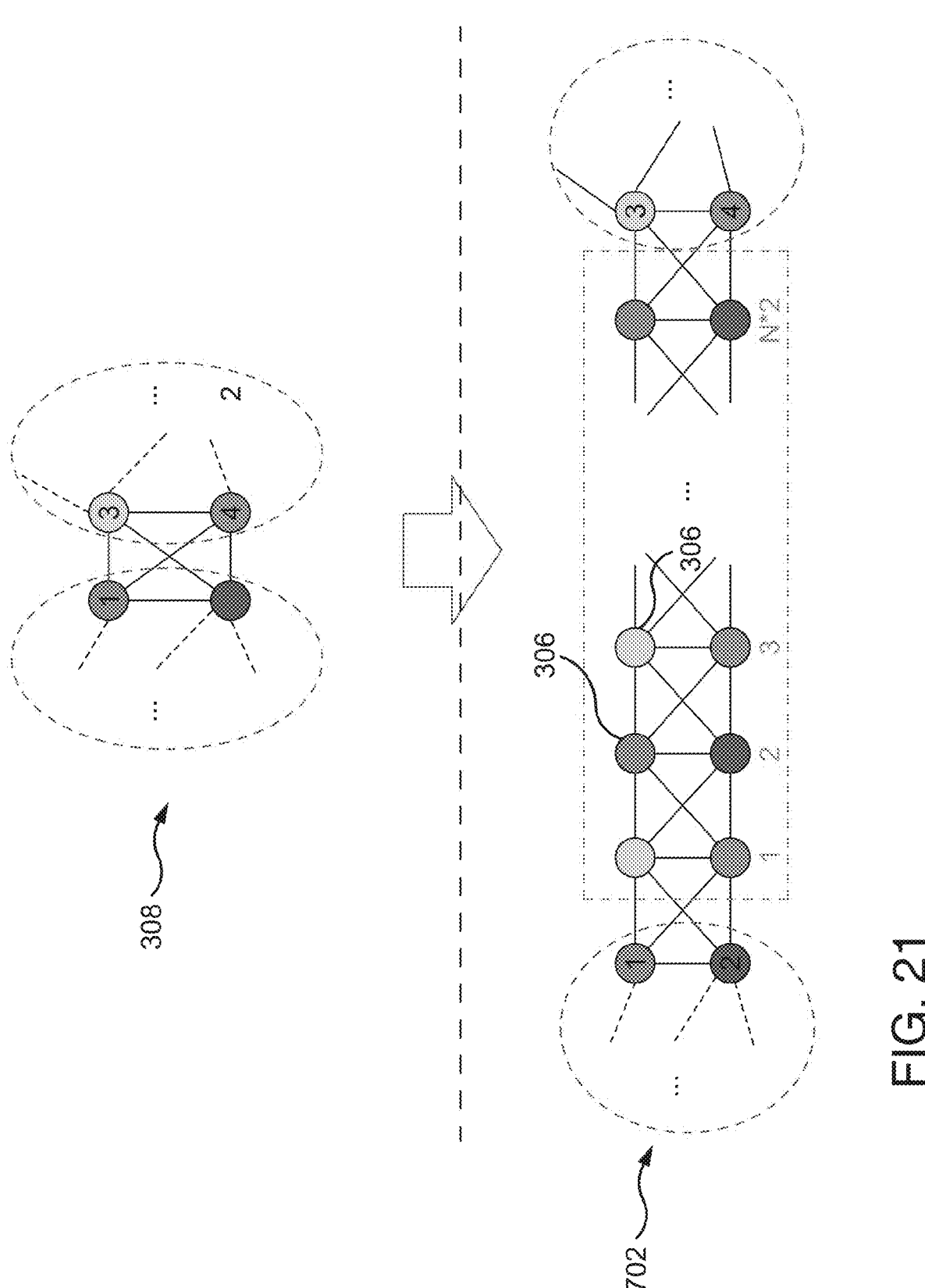
FIG. 21 illustrates an example layer assignment.

FIG. 21 illustrates an example layer assignment. The example of FIG. 21 shows one example result of following the three rules when the nodes 1, 2, 3, and 4 of the reduced node structure or reduced graph 308 are assigned to four layers. As seen in FIG. 21, the resultant layer assignment yields the same number of conflicts (zero conflicts) as the reduced node structure or reduced graph 308.

To begin, because the nodes 1 and 2 are assigned to the first and second layers (indicated by the colors green and blue) and the nodes 3 and 4 are assigned to the third and fourth layers (indicated by the colors yellow and orange), Rule 1 indicates that assignment can start from either end. In the example of FIG. 21, assignment begins from the left end at nodes 1 and 2. According to Rule 2, the first pair of nodes 306 after the nodes 1 and 2 are assigned to different layers, which are also different from the layers assigned to the nodes 1 and 2. According to Rule 3, as many nodes 306 of this first pair of nodes 306 should be assigned to the third and fourth layers (indicated by the colors yellow and orange) because the nodes 3 and 4 at the opposite end of the k4 line structure 702 are assigned to the third and fourth layers (indicated by the colors yellow and orange). Because nodes 1 and 2 are not assigned to the third and fourth layers (indicated by the colors yellow and orange), one of the first pair of nodes 306 is assigned to the third layer (indicated by the color yellow) and the other is assigned to the fourth layer (indicated by the color orange).

The assignment process then proceeds to the second pair of nodes 306 to the right of the first pair of nodes 306. According to Rule 2, the second pair of nodes 306 should be assigned to different layers, which are also different from the layers assigned to the first pair of nodes 306. As a result, the second pair of nodes 306 is assigned to the first layer (indicated by the color green) and the second layer (indicated by the color blue). This process continues until the end of the k4 line structure 702 with the nodes 3 and 4 is reached.

As seen in FIG. 21, the assignment process results in zero conflicts, which is equal to the zero conflicts in the reduced graph 308.

Figure 22:
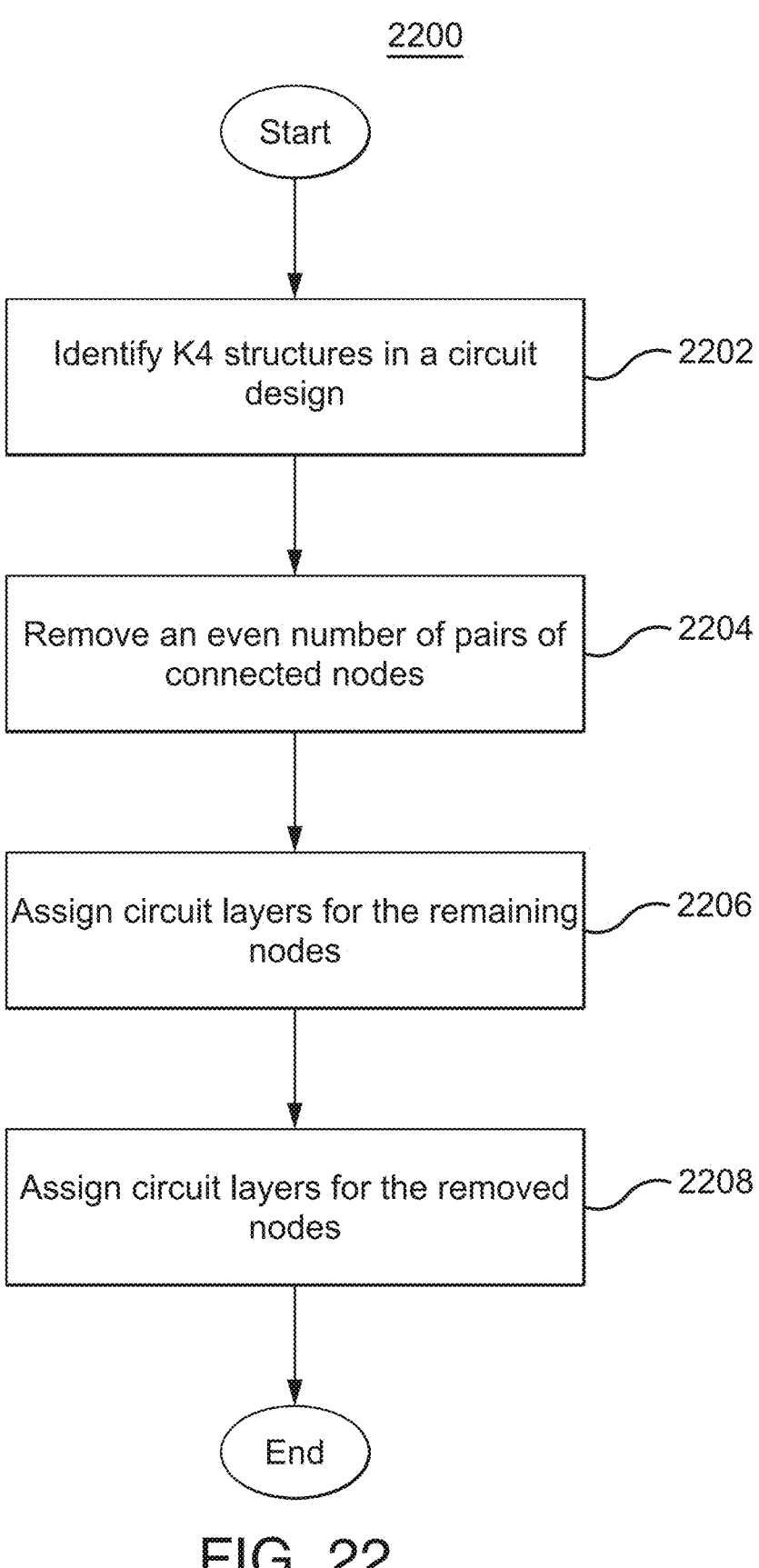
FIG. 22 is a flowchart of an example method for assigning circuit layers.

FIG. 22 is a flowchart of an example method 2200 for assigning circuit layers. In certain embodiments, a computer system (e.g., the computer system 2400 shown in FIG. 24) performs the method 2200. By performing the method 2200, the computer system reduces the time it takes to assign circuit layers during the circuit design process and reduces the amount or processor and memory resources used during circuit design.

At 2202, the computer system identifies k4 structures 202 in a circuit design 100. For example, the computer system may generate a graph 302 representing the circuit design 100. The graph may include nodes 306 representing nodes 102 in the circuit design 100. The nodes 306 may be connected in the graph 302 if, in the circuit design 100, there is an edge 104 connecting the nodes 102 represented by the nodes 306. The computer system may then determine a degree of the nodes 306 in the graph 302. The degree of a node 306 may be the number of nodes 306 connected to that node 306. The computer system may then determine a subgraph 502 that includes the nodes 306 of the graph that have a threshold degree (e.g., a degree of five).

The computer system may then identify k4 structures 202 in the subgraph 502. For example, the computer system may identify a structure of four nodes 306 in which all the nodes 306 are connected to each other (e.g., six connections). The computer system may then form a k4 line structure 702 using these k4 structures 202.

At 2204, the computer system removes an even number of pairs of connected nodes 306 from the k4 line structure 202. In some embodiments, the computer system removes pairs of connected nodes 306 that are not at the ends of the k4 line structure 702. The remaining nodes 306 are then connected to form the reduced node structure or reduced graph 308.

At 2206, the computer system assigns circuit layers for the nodes 306 in the reduced node structure or reduced graph 308. The computer system may assign any suitable number of circuit layers to these nodes 306. For example, the computer system may assign each of the nodes 306 to different circuit layers, to the same circuit layers, or a mix of the same circuit layers and different circuit layers.

At 2208, the computer system assigns circuit layers for the nodes 306 in the k4 line structure 702 (e.g., the nodes 306 that were removed to form the reduced node structure or reduced graph 308). The computer system may follow certain rules when assigning these circuit layers. Rule 1 indicates that the assignment process should begin from an end of the k4 line structure 702 where the nodes 306 are assigned to different circuit layers and move towards the other end. Rule 2 indicates that the circuit layers assigned to a pair of connected nodes 306 should be different from each other and different from the circuit layers assigned to the preceding pair of connected nodes 306. Rule 3 indicates that the circuit layers assigned to the first pair of connected nodes 306 in this step should include as many of the same circuit layers as the circuit layers assigned to the nodes 306 at the opposite end of the k4 line structure 702. By following these rules, the computer system may ensure that the layer assignment results in the same or fewer number of conflicts as in the reduced graph 308.

An example flow of the layer assignment process is as follows:

1. Find the k4 line structures in original large circuit design.

2. Reduce the original large circuit design to smaller reduced circuit design

3. Assign the nodes of the reduced circuit design to layers.

4. Color the nodes in the original large graph that were removed during the reduction process (e.g., without introducing layer or color conflicts).

In some embodiments, steps 1, 2, and 4 are performed quickly, and the general time complexity of these steps is close to linear. As a result, if the original input contains k4 line structures, this flow can reduce the circuit design into a smaller circuit design, and save some coloring time. If the original input contains no such structure (and so reduction is not possible), this flow will only increase very little runtime.

In a test of an embodiment, directly running the software program on the original large circuit diagram yielded a runtime of 3603.22 seconds. By following steps 1, 2, 3, and 4 described above, the runtime was reduced to 6.88 seconds.

Other kinds of circuit design reductions (e.g., reducing low-degree ((<4) vertices) can also be applied before and after the circuit design reduction. Mixing different kinds of circuit design reductions, and even using them iteratively, may further reduce the runtime of the layer assignment or coloring process.

Figure 23:
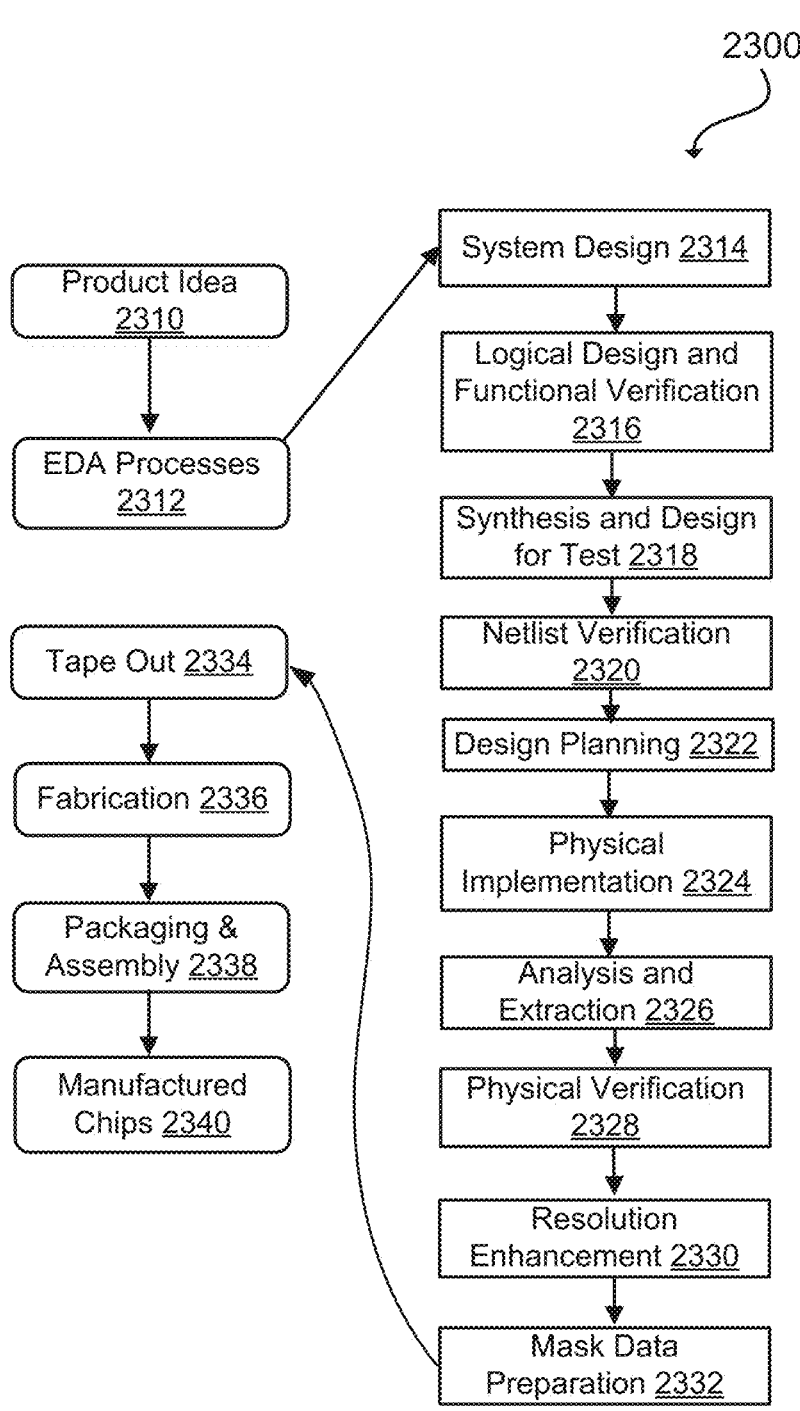
FIG. 23 depicts a flowchart of various processes used during the design and manufacture of an integrated circuit in accordance with some embodiments of the present disclosure.

FIG. 23 illustrates an example set of processes 2300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 2310 with information supplied by a designer, information which is transformed to create an article of manufacture that uses a set of EDA processes 2312. When the design is finalized, the design is taped-out 2334, which is when artwork (e.g., geometric patterns) for the integrated circuit is sent to a fabrication facility to manufacture the mask set, which is then used to manufacture the integrated circuit. After tape-out, a semiconductor die is fabricated 2336 and packaging and assembly processes 2338 are performed to produce the finished integrated circuit 2340.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 23. The processes described by be enabled by EDA products (or tools).

During system design 2314, functionality of an integrated circuit to be manufactured is specified. The design may be adjusted for desired characteristics such as power consumption, performance, area (physical and/or lines of code), and reduction of costs, etc. Partitioning of the design into different types of modules or components can occur at this stage.

During logic design and functional verification 2316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 2318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be adjusted for a target semiconductor manufacturing technology. Additionally, the finished integrated circuit may be tested to verify that the integrated circuit satisfies the requirements of the specification.

During netlist verification 2320, the netlist is checked for compliance with timing constraints and for correspondence with the HDL code. During design planning 2322, an overall floor plan for the integrated circuit is constructed and analyzed for timing and top-level routing.

During layout or physical implementation 2324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 2326, the circuit function is verified at the layout level, which permits refinement of the layout design. During physical verification 2328, the layout design is checked to ensure that manufacturing constraints are correct, such as DRC constraints, electrical constraints, lithographic constraints, and that circuitry function matches the HDL design specification. During resolution enhancement 2330, the geometry of the layout is transformed to improve how the circuit design is manufactured.

During tape-out, data is created to be used (after lithographic enhancements are applied if appropriate) for production of lithography masks. During mask data preparation 2332, the 'tape-out' data is used to produce lithography masks that are used to produce finished integrated circuits.

A storage subsystem of a computer system (such as computer system 2400 of FIG. 24) may be used to store the programs and data structures that are used by some or all of the EDA products described herein, and products used for development of cells for the library and for physical and logical design that use the library.

Figure 24:
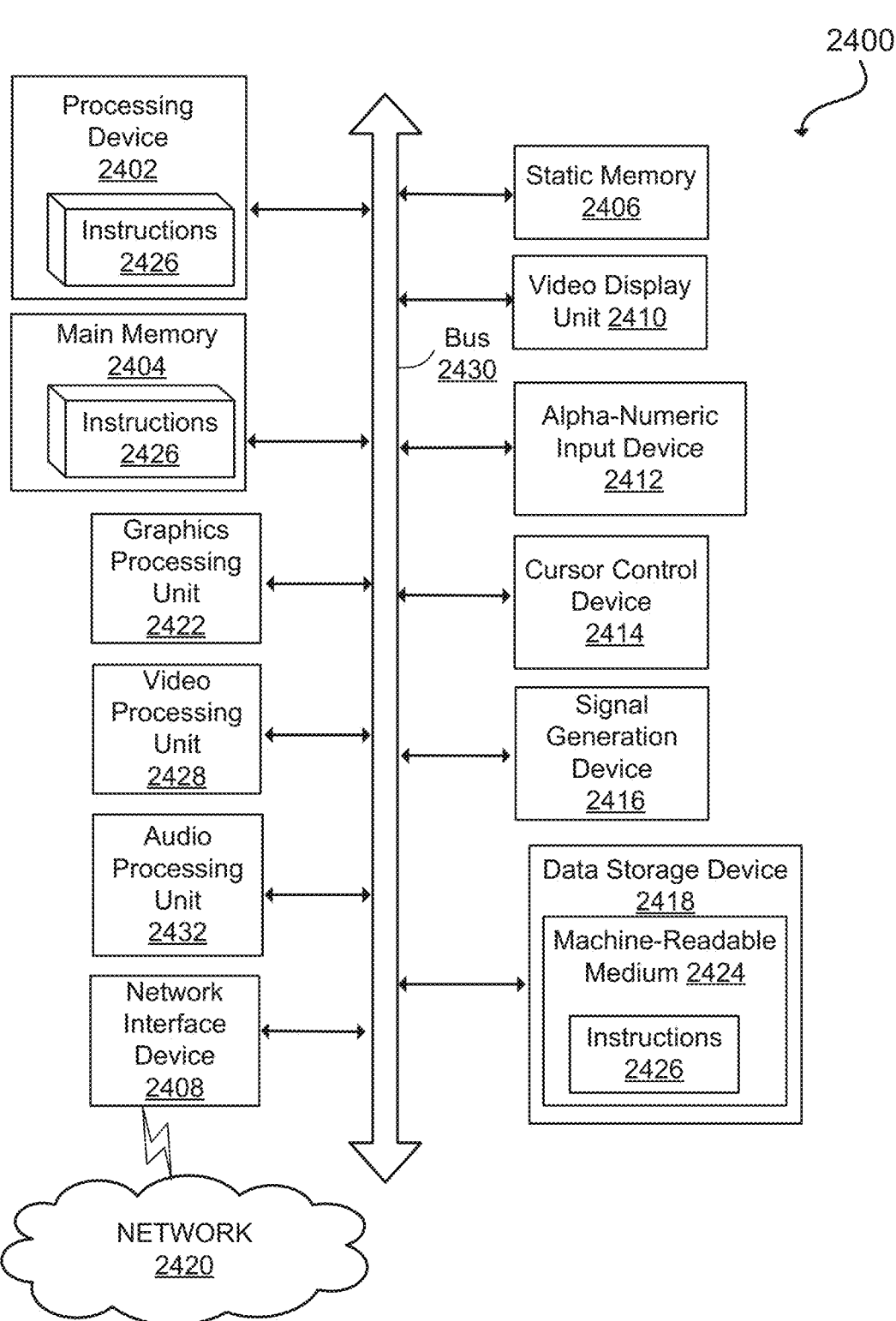
FIG. 24 depicts a diagram of an example computer system in which embodiments of the present disclosure may operate.

FIG. 24 illustrates an example machine of a computer system 2400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 2400 includes a processing device 2402, a main memory 2404 (e.g., read-only memory (ROM), flash memory, dynamic random access memory (DRAM) such as synchronous DRAM (SDRAM), a static memory 2406 (e.g., flash memory, static random access memory (SRAM), etc.), and a data storage device 2418, which communicate with each other via a bus 2430.

Processing device 2402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 2402 may also be one or more special-purpose processing devices such as an application specific integrated circuit (ASIC), a field programmable gate array (FPGA), a digital signal processor (DSP), network processor, or the like. The processing device 2402 may be configured to execute instructions 2426 for performing the operations and steps described herein.

The computer system 2400 may further include a network interface device 2408 to communicate over the network 2420. The computer system 2400 also may include a video display unit 2410 (e.g., a liquid crystal display (LCD) or a cathode ray tube (CRT)), an alphanumeric input device 2412 (e.g., a keyboard), a cursor control device 2414 (e.g., a mouse), a graphics processing unit 2422, a signal generation device 2416 (e.g., a speaker), graphics processing unit 2422, video processing unit 2428, and audio processing unit 2432.

The data storage device 2418 may include a machine-readable storage medium 2424 (also known as a non-transitory computer-readable medium) on which is stored one or more sets of instructions 2426 or software embodying any one or more of the methodologies or functions described herein. The instructions 2426 may also reside, completely or at least partially, within the main memory 2404 and/or within the processing device 2402 during execution thereof by the computer system 2400, the main memory 2404 and the processing device 2402 also constituting machine-readable storage media.

In some implementations, the instructions 2426 include instructions to implement functionality corresponding to the present disclosure. While the machine-readable storage medium 2424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 2402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for determining layers for nodes in an electronic circuit design, the method comprising:
   identifying a plurality of structures in an electronic circuit design, wherein each of the plurality of structures comprises four nodes of the electronic circuit design and each of the four nodes are connected to every other node in the respective structure;
   removing, from the plurality of structures, an even number of pairs of connected nodes of the electronic circuit design to form a reduced node structure;
   assigning lithographic circuit layers for the nodes in the reduced node structure; and
   assigning, by a processing device, lithographic circuit layers for the pairs of connected nodes removed from the plurality of structures based on the assigned lithographic circuit layers for the nodes in the reduced node structure.

2. The method of claim 1, wherein each of the pairs of connected nodes is shared by two of the plurality of structures.

3. The method of claim 1, wherein removing the even number of pairs of connected nodes from the plurality of structures comprises refraining from removing a pair of connected nodes at a first end of the plurality of structures and refraining from removing a pair of connected nodes at a second end of the plurality of structures opposite the first end.

4. The method of claim 3, wherein assigning the lithographic circuit layers for the pairs of connected nodes removed from the plurality of structures comprises assigning at least one node in a first pair of connected nodes of the pairs of connected nodes to a same lithographic circuit layer assigned to a node in the pair of connected nodes at the second end, wherein the first pair of connected nodes is connected to the pair of connected nodes at the first end.

5. The method of claim 3, wherein assigning the lithographic circuit layers for the pairs of connected nodes removed from the plurality of structures comprises:

determining that nodes of the pair of connected nodes at the first end are assigned to different lithographic circuit layers; and assigning the lithographic circuit layers for a pair of connected nodes connected to the pair of connected nodes at the first end before assigning lithographic circuit layers for other pairs of connected nodes removed from the plurality of structures.

6. The method of claim 1, wherein assigning the lithographic circuit layers for the pairs of connected nodes removed from the plurality of structures comprises, for each of the pairs of connected nodes, assigning a first node and a second node of the respective pair of connected nodes to different lithographic circuit layers.

7. The method of claim 1, wherein assigning the lithographic circuit layers for the pairs of connected nodes removed from the plurality of structures comprises, for each of the pairs of connected nodes, assigning lithographic circuit layers to the respective pair of connected nodes different from lithographic circuit layers assigned to another pair of connected nodes connected to the respective pair of connected nodes.

8. The method of claim 1, further comprising performing lithography for the nodes and the pairs of connected nodes based on their assigned lithographic circuit layers.

9. A system for determining layers for nodes in an electronic circuit design, the system comprising:

a memory; and a processor communicatively coupled to the memory, the processor configured to:

identify a plurality of structures in an electronic circuit design, wherein each of the plurality of structures corresponds to four nodes of the electronic circuit design and each of the four nodes are connected to every other node in the respective structure;

remove, from the plurality of structures, an even number of pairs of connected nodes of the electronic circuit design to form a reduced node structure;

assign lithographic circuit layers for the nodes in the reduced node structure; and assign lithographic circuit layers for the pairs of connected nodes removed from the plurality of structures based on the assigned lithographic circuit layers for the nodes in the reduced node structure.

10. The system of claim 9, wherein each of the pairs of connected nodes is shared by two of the plurality of structures.

11. The system of claim 9, wherein removing the even number of pairs of connected nodes from the plurality of structures comprises refraining from removing a pair of connected nodes at a first end of the plurality of structures and refraining from removing a pair of connected nodes at a second end of the plurality of structures opposite the first end.

12. The system of claim 11, wherein assigning the lithographic circuit layers for the pairs of connected nodes removed from the plurality of structures comprises assigning at least one node in a first pair of connected nodes of the pairs of connected nodes to a same lithographic circuit layer assigned to a node in the pair of connected nodes at the second end, wherein the first pair of connected nodes is connected to the pair of connected nodes at the first end.

13. The system of claim 11, wherein assigning the lithographic circuit layers for the pairs of connected nodes removed from the plurality of structures comprises:

determining that nodes of the pair of connected nodes at the first end are assigned to different lithographic circuit layers; and assigning the lithographic circuit layers for a pair of connected nodes connected to the pair of connected nodes at the first end before assigning lithographic circuit layers for other pairs of connected nodes removed from the plurality of structures.

14. The system of claim 9, wherein assigning the lithographic circuit layers for the pairs of connected nodes removed from the plurality of structures comprises, for each of the pairs of connected nodes, assigning a first node and a second node of the respective pair of connected nodes to different lithographic circuit layers.

15. The system of claim 9, wherein assigning the lithographic circuit layers for the pairs of connected nodes removed from the plurality of structures comprises, for each of the pairs of connected nodes, assigning lithographic circuit layers to the respective pair of connected nodes different from lithographic circuit layers assigned to another pair of connected nodes connected to the respective pair of connected nodes.

16. The system of claim 9, wherein lithography is performed for the nodes and the pairs of connected nodes based on their assigned lithographic circuit layers.

17. A non-transitory computer readable medium storing instructions that, when executed by a processor, cause the processor to:

identify an even number of pairs of connected nodes of an electronic circuit design;

remove a plurality of nodes of the electronic circuit design outside the identified even number of pairs of connected nodes;

assign lithographic circuit layers for the removed plurality of nodes; and assign lithographic circuit layers for the identified even number of pairs of connected nodes based on the assigned lithographic circuit layers for the removed plurality of nodes.

18. The medium of claim 17, wherein each of the even number of pairs of connected nodes comprises four nodes of the circuit design and each of the four nodes are connected to every other node in the even number of pairs of connected nodes.

19. The medium of claim 17, wherein assigning the identified even number of pairs of connected nodes comprises, for each of the pairs of connected nodes, assigning a first node and a second node of the respective pair of connected nodes to different lithographic circuit layers.

20. The medium of claim 17, wherein assigning the lithographic circuit layers for the identified even number of pairs of connected nodes comprises, for each of the pairs of connected nodes, assigning lithographic circuit layers to the respective pair of connected nodes different from lithographic circuit layers assigned to another pair of connected nodes connected to the respective pair of connected nodes.

* * * * *